United States Patent [19]

Hirao et al.

[11] Patent Number: 4,996,596
[45] Date of Patent: Feb. 26, 1991

[54] PHASE SYNCHRONIZING CIRCUIT IN VIDEO SIGNAL RECEIVER AND METHOD OF ESTABLISHING PHASE SYNCHRONIZATION

[75] Inventors: Yoshichika Hirao, Osaka; Nobukazu Hosoya, Nara, both of Japan

[73] Assignee: Sanyo Electric Co., Ltd., Moriguchi, Japan

[21] Appl. No.: 401,691

[22] Filed: Sep. 1, 1989

[30] Foreign Application Priority Data

Sep. 2, 1988 [JP] Japan .............................. 63-220806
Apr. 7, 1989 [JP] Japan ................................ 1-89114

[51] Int. Cl.⁵ .............................................. H04N 5/04
[52] U.S. Cl. ................................... 358/158; 358/148; 358/153
[58] Field of Search ............... 358/148, 149, 153, 158; 331/11; 375/110, 111, 118, 120

[56] References Cited

U.S. PATENT DOCUMENTS

| | | | |
|---|---|---|---|
| 4,069,462 | 1/1978 | Dunn | 331/11 |
| 4,228,462 | 10/1980 | van Straaten | 358/158 |
| 4,319,276 | 3/1982 | Cense et al. | 358/158 |
| 4,488,170 | 12/1984 | Nillesen | 358/158 |
| 4,672,329 | 6/1987 | Hikawa | 331/11 |
| 4,672,447 | 6/1987 | Möring et al. | 358/158 |
| 4,855,683 | 8/1989 | Troudet et al. | 331/11 |

FOREIGN PATENT DOCUMENTS 55-8161 1/1980 Japan .
57-41078 3/1982 Japan .

Primary Examiner—John W. Shepperd
Assistant Examiner—Michael D. Parker
Attorney, Agent, or Firm—Armstrong, Nikaido, Marmelstein, Kubovcik & Murray

[57] ABSTRACT

A circuit for providing a signal phase locked to a horizontal synchronization signal included in a received video signal includes a first PLL loop (16, 44, 46; 16, 46′, 204) and a second PLL or AFC loop (26, 44, 46; 26, 44, 46′, 204). The first PPL loop has a plurality of lock ranges. The second PLL or AFC loop, which has an output characteristic with a single S curve, has one lock range large in width. The second PLL or AFC loop is supplied with a horizontal synchronization signal separated in a synchronization separating circuit via a bandpass filter. The first PLL loop is directly supplied with a horizontal synchronization signal extracted in the synchronization separating circuit. The first PLL loop shares a voltage controlled oscillator (46; 46′) and a frequency divider (46; 204) with the second PLL loop or AFC loop. This phase synchronizing circuit further includes a circuit (48) for detecting synchronization/-non-synchronization of an output of the frequency divider circuit with the horizontal synchronization signal separated/extracted in the synchronization separating circuit, and a switching circuit (42) for activating one of the first PLL loop and the second PLL or AFC loop in response to an output of this synchronization detector circuit.

15 Claims, 13 Drawing Sheets

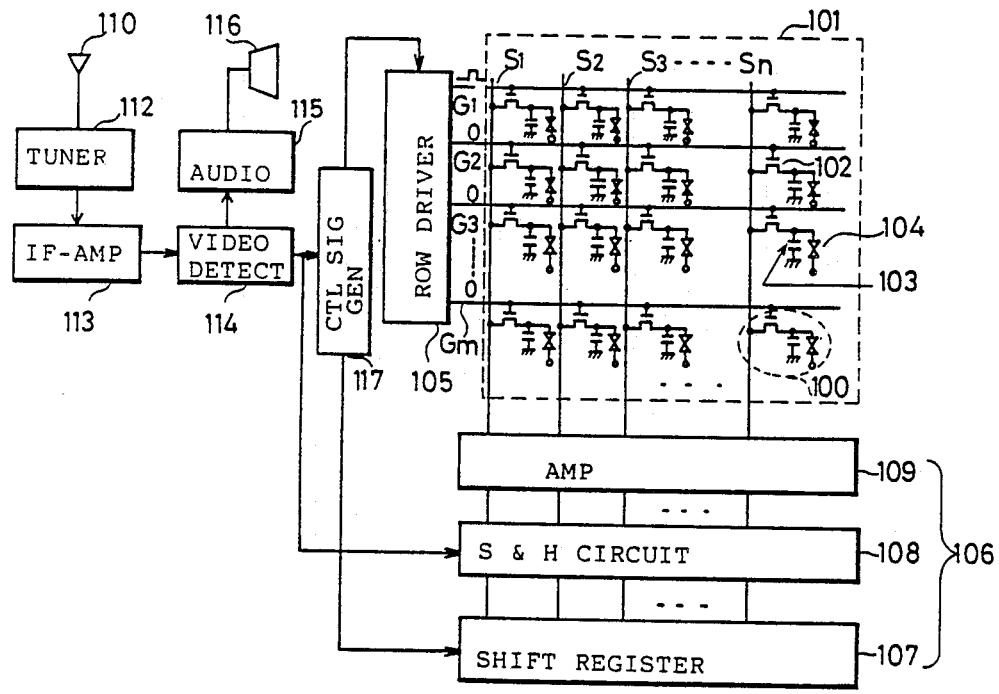
FIG.1 PRIOR ART
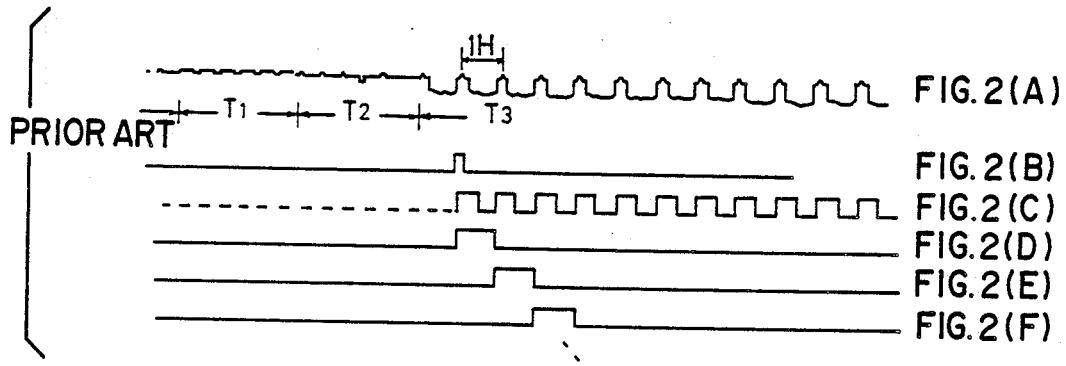
PRIOR ART
FIG.2(A)
FIG.2(B)
FIG.2(C)
FIG.2(D)
FIG.2(E)
FIG.2(F)
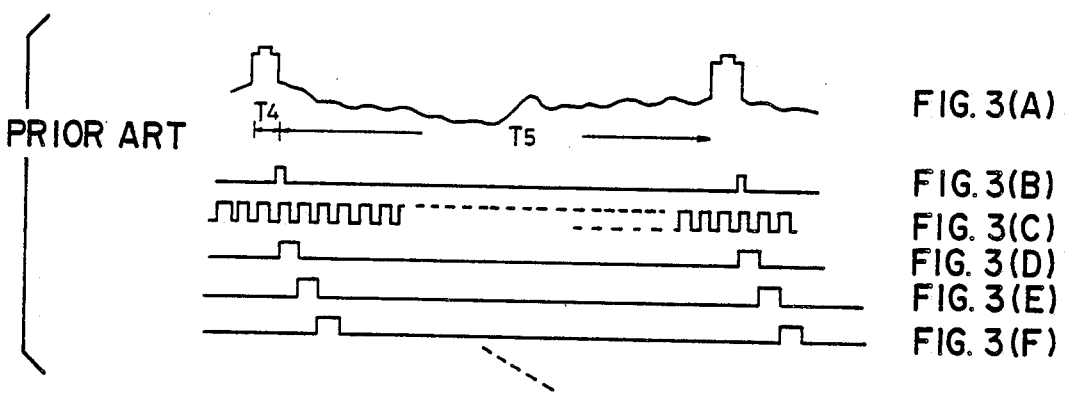
PRIOR ART
FIG.3(A)
FIG.3(B)
FIG.3(C)
FIG.3(D)
FIG.3(E)
FIG.3(F)

FIG. 7(a) PRIOR ART STRONG ELECTRIC FIELD SYNC
FIG. 7(b) PRIOR ART WEAK ELECTRIC FIELD SYNC
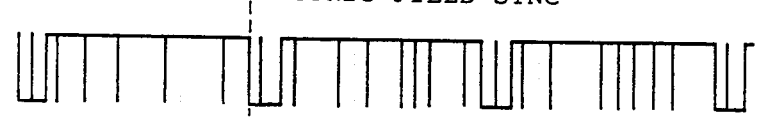
FIG. 7(c) PRIOR ART
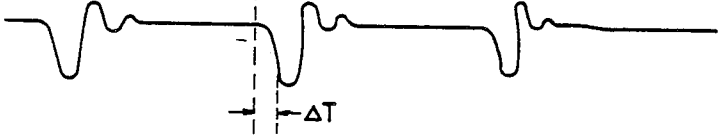
FIG. 8
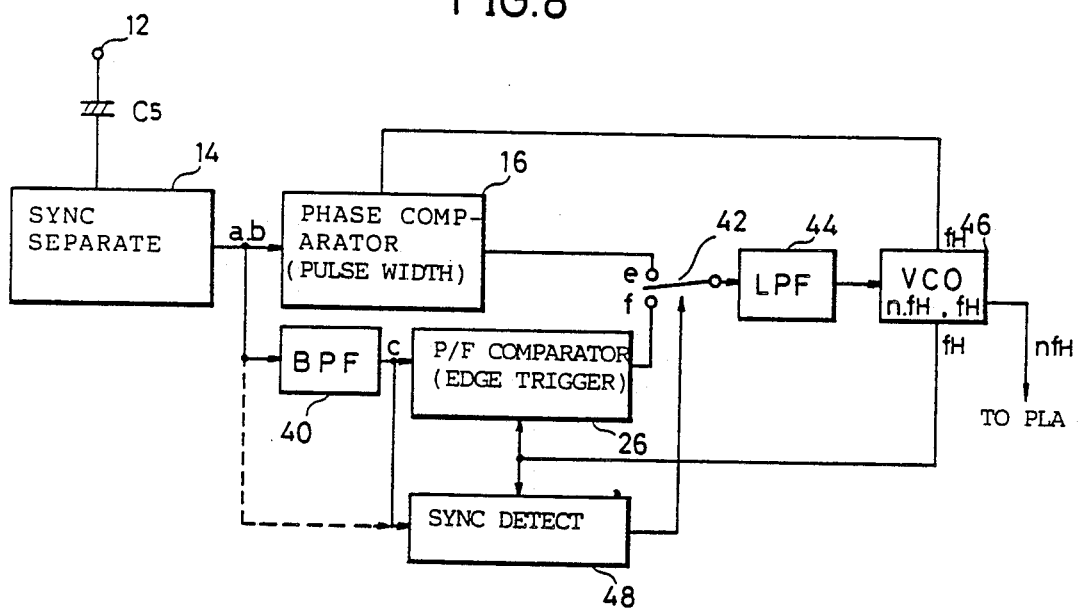

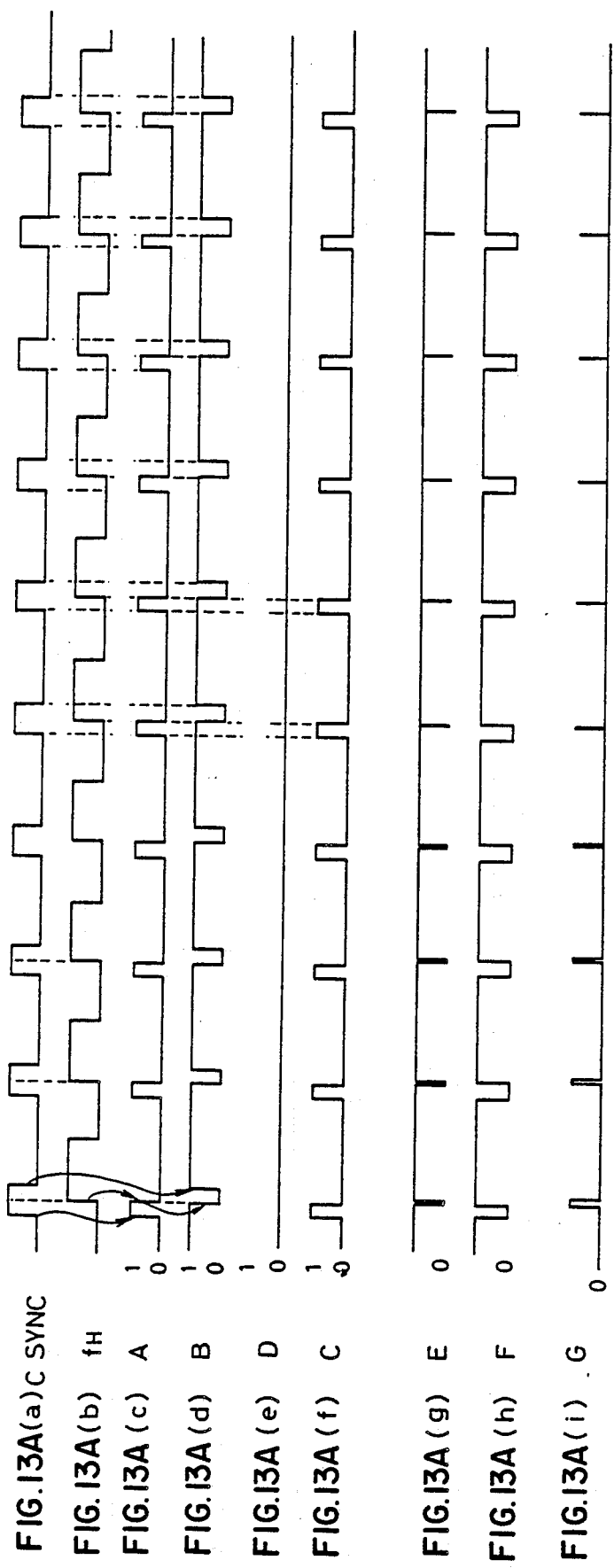

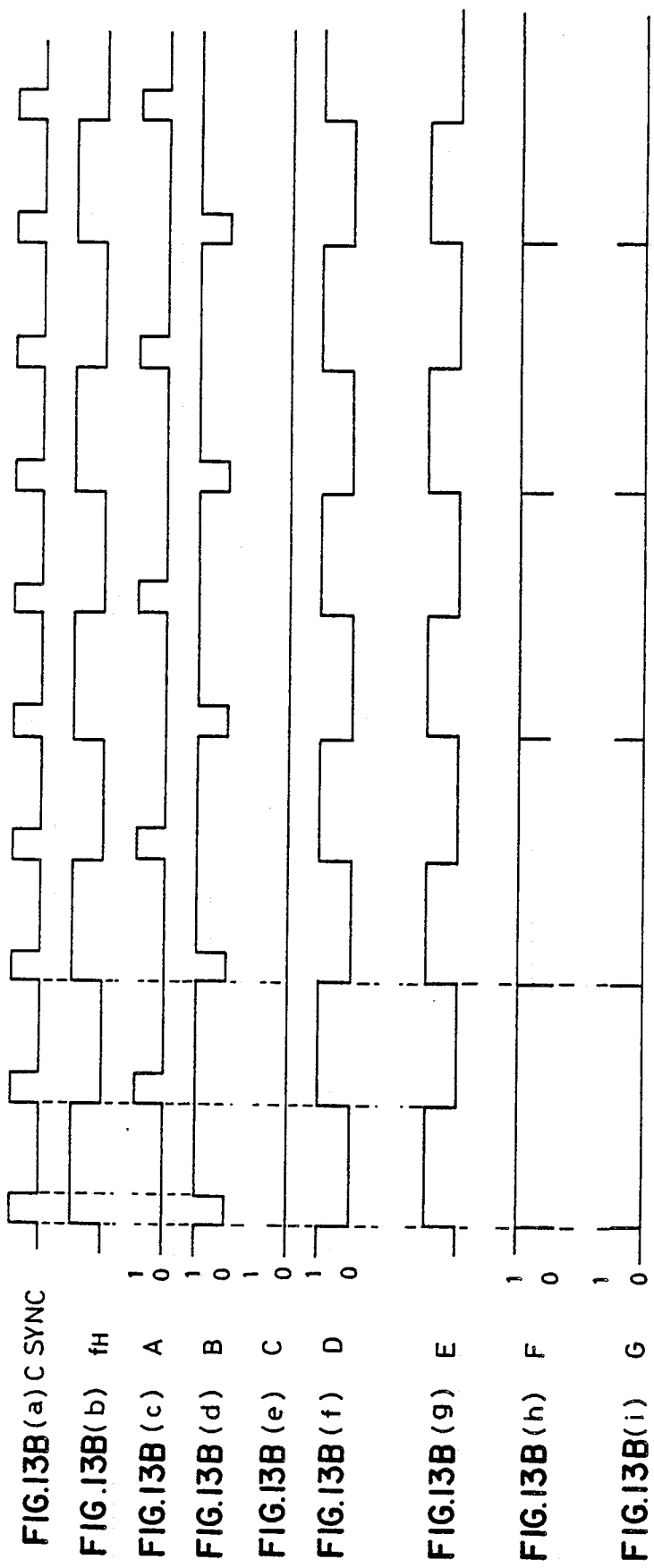

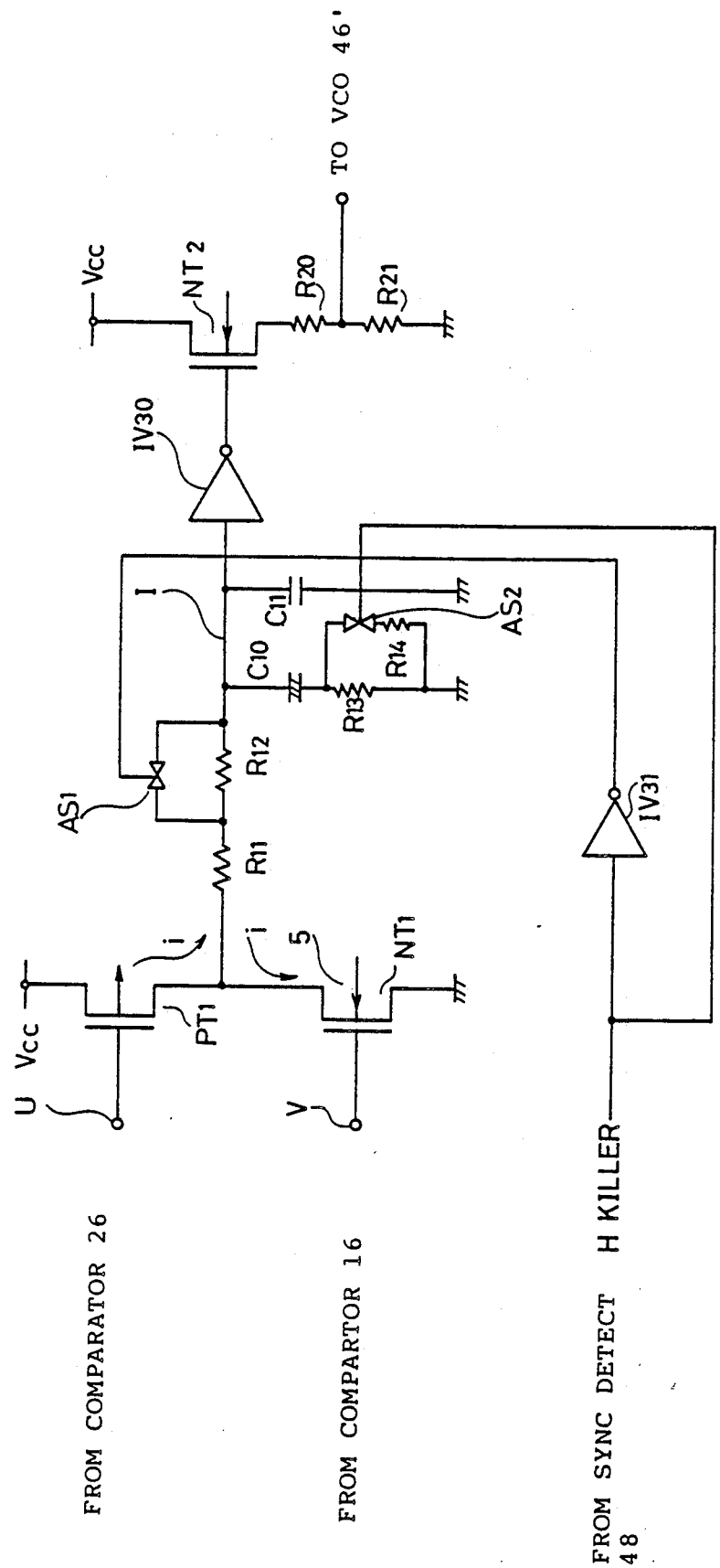

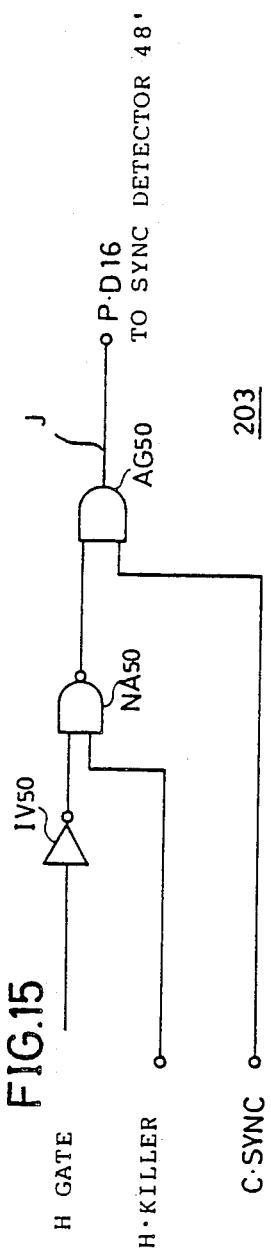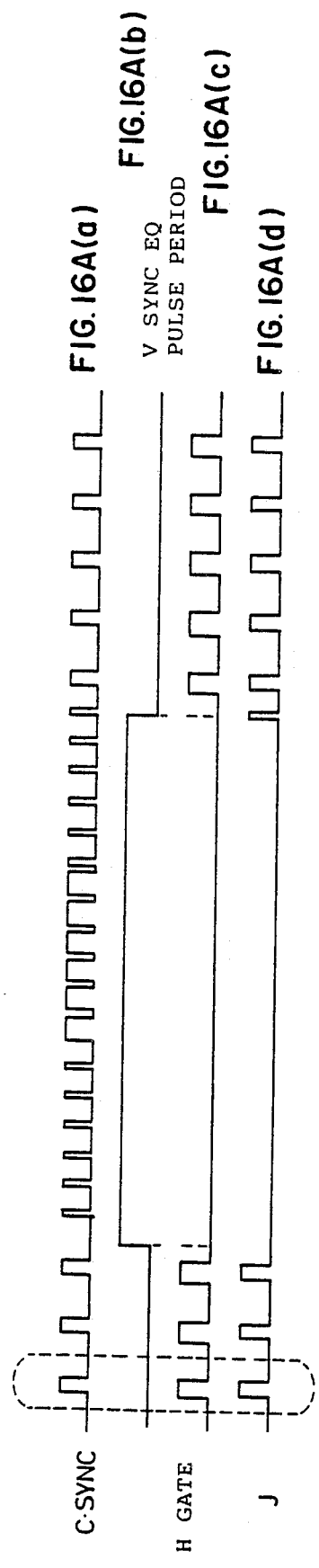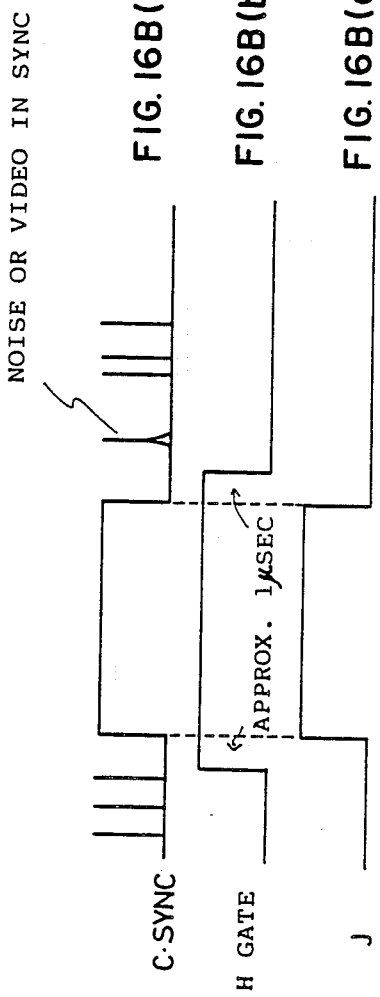

PHASE SYNCHRONIZING CIRCUIT IN VIDEO SIGNAL RECEIVER AND METHOD OF ESTABLISHING PHASE SYNCHRONIZATION

BACKGROUND OF THE INVENTION

1. Field of the Invention

The present invention relates generally to a circuit for and a method of providing phase synchronization and, more particularly, to a circuit for and a method of establishing phase synchronization of a horizontal synchronization signal, employed in a video signal receiver such as a TV (a television receiver), an LCD-TV (a liquid crystal display television receiver), or a VTR (a video tape recorder). More specifically, it relates to a circuit for and a method of ensuring establishment of horizontal synchronization even if employed for a video receiver having a matrix type video display such as a liquid crystal display with different numbers of pixels on a line.

2. Description of the Background Art

There is a liquid crystal panel as a small and thin video display with low power consumption. First of all, a brief description will be given on a configuration and an operation of a video signal reproducing apparatus employing this liquid crystal panel. FIG. 1 shows a schematic configuration of a whole television receiver employing the liquid crystal panel as a display device. The configuration shown in this FIG. 1 is, for example, disclosed in Japanese Pat. Laying Open Gazette (Kokai) No. 57-41078.

Referring to FIG. 1, a liquid crystal panel 101 includes liquid crystal pixels 100 arranged in m rows and n columns. The liquid crystal pixels 100 each include a switching transistor 102, a charge holding capacitor 103 and a liquid crystal element 104. Gate lines Gl–Gm are provided for selecting a particular row of the liquid crystal pixels. Source lines Sl–Sn are provided for selecting a particular column of the liquid crystal pixels. The respective switching elements 102 has a gate connected to the gate line Gi (i=1–m) and one conduction terminal (a source) connected to the source line Sj (j=1–n).

A row driver 105 and a column driver 106 are provided to drive the liquid crystal panel 101. The row driver 105 sequentially selects the gate line Gi one by one in response to a control signal from a control signal generator 117. The column driver 106 includes a shift register 107, a sample and hold circuit 108 and an amplifier 109. The shift register 107 formed of unit shift registers of n stages generates a signal for defining operation timing of the sample and hold circuit 108 in response to the control signal from the control signal generator 117. The sample and hold circuit 108 samples and holds video signals (R, G and B) from a video detector 114 in response to clock signals from the shift register 107. This sample and hold circuit 108 includes n unit sample and hold circuits provided corresponding to the source lines Sj. The amplifier 109 amplifies video information held by the sample and holds circuit 108 to transmit the same onto respective source lines Sj.

There are provided an antenna 110 for receiving video signals, a tuner 112, an intermediate frequency amplifier 113, the video detector 114, an audio processing circuit 115, and a loudspeaker 116. The tuner 112 selects a frequency band of a desired channel from the received video signals. The intermediate frequency amplifier 113 converts the video signals selected through the tuner 112 into a signal of intermediate frequency and amplifies the same to be transmitted to the video detector 114. The video detector 114 detects a video signal from a composite video signal converted into this intermediate frequency, and also separates an audio signal from the video signal to supply the same to the audio processing circuit 115. The audio processing circuit 115 detects and reproduces this audio signal to supply the same to the loudspeaker 116. The video signal from the video detector 114 is applied to the sample and hold circuit 108.

The control signal generator 117 separates a synchronization signal (a horizontal and vertical signal) from the video signal received from the video detector 114 and derives a signal required for driving the rows and columns of the liquid crystal panel 101. An operation of the circuit will be briefly described.

First, the operation of the row driver 105 will be described with reference to FIGS. 2. A video signal shown in FIG. 2 (A) is applied from the video detector 114. The video signal has a vertical synchronization signal period T1, a vertical fly-back period T2 and a video signal period T3. The video signal period T3 includes horizontal synchronization signals. The control signal generator 117 generates a signal (FIG. 2 (B)) indicating initiation of one field in response to the first horizontal synchronization signal after the vertical period T2 is completed. Accordingly, the initiation of the one field is detected. The control signal generator 117 subsequently generates a clock signal (FIG. 2 (C)) of a period 1H (H: one horizontal scanning period). In response to this clock signal (a scanning clock signal), the row driver 105 generates signals (FIG. 2 (D) to (F)) for sequentially raising the gate line Gj in potential. Accordingly, only a single gate line Gi is selected during one horizontal scanning period. The switching transistors 102 connected to this particular row (the gate line Gi) are turned on during a horizontal fly-back period, so that the pixel information transmitted onto the source lines Sl–Sn is transmitted onto the respective liquid crystal elements 104.

Meanwhile, an operation waveform diagram of the column driver 106 is as shown in FIGS. 3. The column driver 106 repeats the same operation for each 1H period. The video signal in the 1H period, as shown in FIG. 3 (A), includes a horizontal synchronization signal period and horizontal fly-back period T4, and a period T5 during which a video information is transmitted. First of all, the shift register 107 is supplied with a signal corresponding to the horizontal synchronization signal of the video signal as shown in FIG. 3 (B), and as a transfer clock pulse, a clock pulse having a frequency of the period T=T5/n' (the n' represents the number of pixels connected to a single row), or T=(T4+T5)/n, as shown in FIG. 3 (C). Accordingly, as shown in FIGS. 3 (D) to 3(F), clock signals sequentially shifted by T in the phase are output from an output of each stage of the shift register 107. The clock signals (FIGS. 3 (D) through 3 (F)) from the shift register 107 are applied to the sample and hold circuit 108. In response to the clock signals, the sample and hold circuit 108 samples the video signal derived from the video detector 114 and holds the same during the 1H period. Accordingly, information corresponding to a row of pixels is held in the sample and hold circuit 108. This pixel information is in parallel transmitted via the amplifier 109 onto the source lines Sl–Sn.

In order to hold a row of the pixel information in the sample and hold circuit 108 as described above, it is necessary to generate clock signals with the frequency n times $f_H$ ($f_H=1/H$) which are synchronized in phase with a received synchronization signal.

In the case that the number of the pixels in a row of the liquid crystal panel 101 is fixed, each of the clock signals generated by the control signal generator 117 may be selectively generated corresponding to the number of the pixels. However, in order to configure a general-purpose control signal generator to be employed for a liquid crystal panel with various numbers of the pixels, it is necessary to employ a circuit configured in consideration of changes in the number, n, of the pixels in a row.

FIG. 4 shows an example of a conventional circuit configuration for generating horizontal synchronizing clock signals which can be employed for various kinds of the liquid crystal panels. One of ICs (integrated circuits) for horizontal phase synchronization having such configuration as shown in FIG. 4 is µpD6109G, a product of by NEC (Nihon Electronics Corp).

Referring to FIG. 4, a conventional horizontal phase synchronizing circuit includes a synchronization separating circuit 14 at its input stage. The synchronization separating circuit 14 receives a video signal via a coupling capacitor C5 to extract a synchronization signal (horizontal and vertical). The horizontal phase synchronizing circuit further includes a first PLL (Phase Locked Loop) loop and a second PLL loop.

The first PLL loop includes a first phase comparator 16, a first lowpass filter 18, an adjuster 20, a first voltage control type oscillator 22, and a ½ frequency divider 24. The phase comparator 16 compares in phase a horizontal synchronization signal from the synchronization separating circuit 14 with a signal of a frequency 15.73KHz from the ½ frequency divider 24. The phase comparator 16 is of pulse width detecting type for only comparing the phases of applied signals and has a characteristic immune to noise.

The first lowpass filter 18 includes capacitors C1 and C2 and resistors R1 and R2. The resistor R2 is provided between a terminal PCO and a node N1. The resistor R1 and the capacitor C2 are provided in series between the node N1 and a ground potential. The capacitor C1 is provided in parallel to a series body of the resistor R1 and the capacitor C2. The lowpass filter 18 removes noises included in an output signal of the phase comparator 16 and generates a direct current control voltage.

The adjuster 20 includes resistors R3 and R4 and a variable resistor VR1. The resistor R3 is provided between an output of the lowpass filter 18 and a node N2. The variable resistor VR1 and the resistor R4 are provided in series between the node N2 and the ground potential. This adjuster 20 has a function of controlling an oscillation phase of the voltage control type oscillator 22. That is, adjustment of a resistance value of the variable resistor VR1 adjusts advancing or delaying in phase of an output signal of the voltage control type oscillator 22.

The voltage control type oscillator 22 oscillates with a frequency twice as large as the horizontal scanning frequency (15.73KHz). The ½ frequency divider 24 frequency-divides, by a factor of 2, an output of the first voltage control type oscillator 22 to output a quasi-horizontal synchronization signal $f_H$ to the phase comparator 16.

It is known that the phase comparator 16 which is of the pulse width detecting type as described above, has an output characteristic having a plurality of slopes (S curves) as shown in FIG. 5. In this FIG. 5, the abscissa designates an input signal frequency, and the ordinate designates an output voltage. f0 represents a reference signal. As seen from this figure, the phase comparator 16 provides an output voltage with the same output characteristics also when the input signal frequency to the phase comparator becomes twice or three times the frequency of the reference signal (the horizontal synchronization signal). Therefore, the first PLL loop has lock ranges corresponding to the respective S curves, and thus the first voltage control type oscillator 22 shown in FIG. 4 sometimes oscillates with the frequency twice or three times that in a normal time to become stable.

In order to prevent the first PLL loop from being stable in the frequency band other than that of the reference signal, in the manufacture of the integrated circuit IC, the oscillation frequency range of the first voltage control type oscillator 22 is set to the range of the frequency from f1 to f0 shown in FIG. 5.

The second PLL loop of the horizontal phase synchronizing circuit includes a phase/frequency comparator 26, a second lowpass filter 28, a second voltage control type oscillator 30 and a programmable counter 32. The phase/frequency comparator 26 compares in phase and frequency a horizontal scanning signal from the ½ frequency divider 24 with an output of the programmable counter 32. The second lowpass filter 28 includes a resistor R5 and a capacitor C3. The resistor R5 and capacitor C3 are connected in series between a terminal PFCO and the ground potential. The second lowpass filter 28 removes undesirable high frequency components such as noise components included in the phase/frequency comparator 26, and provides a direct current voltage signal only indicating a result of this comparison so as to apply the same to a voltage control terminal VCOH of the second voltage control type oscillator 30. The second voltage control type oscillator 30 having a large oscillation frequency range oscillates normally with the frequency n times the horizontal scanning frequency. The programmable counter 32 frequency-divides, by a factor of n, an output of the second voltage control type oscillator 30 to derive a signal with the horizontal frequency and transmit the same to the phase/frequency comparator 26, and also applies this n·$f_H$ ($f_H$ is a quasi horizontal scanning frequency signal) to a programmable logic array 33. The programmable logic array 33 provides a horizontal driving clock signal HCLOCK for driving the column driver 106 shown in FIG. 1. The n corresponds to the number of the pixels in a row. Therefore, the value of the n varies depending on the varied number of the pixels of the liquid crystal panel. The oscillation frequency band of the second voltage control type oscillator 30 is designed to have a large width so as to correspond to the various kinds of the liquid crystal panels.

The phase/frequency comparator 26 compares not only the phases but also the frequencies. This comparator 26 has an output characteristic having only a single slope (an S curve) as shown in FIG. 6. In the FIG. 6, the abscissa indicates an input signal frequency, and the ordinate indicates an output voltage. Since the phase/frequency comparator 26 also functions with a frequency error detector, as apparently seen from FIG. 6, the second voltage control type oscillator 30 does not oscillate with the frequency twice or three times the frequency in the normal time ($nf_H$) That is, the second PLL loop has only one lock range so that it can oscillate at a stable state with a desired oscillation frequency.

The conventional horizontal phase synchronizing circuit, shown in FIG. 4 as described above requires two comparators 20 and 30.

It can also be considered, in order to reduce the comparators to only one, that an output of the synchronization separating circuit 14 is directly applied to the phase/frequency comparator 26. However, the following problems occur in such configuration as above. That is, in receiving a strong electric field signal as shown in FIG. 7 (a), the output of the synchronization separating circuit 14 does not include noises, thereby obtaining a stable oscillating signal synchronized in phase with a horizontal synchronization signal. However, in receiving a weak electric field signal as shown in FIG. 7 (b), the output of the synchronization separating circuit 14 includes noises, so that an output of the phase/frequency comparator 26 is affected adversely by the noises, and thus the oscillation frequency of the voltage control type oscillator is fixed to its upper limit value or lower limit value. This causes a problem that the oscillating signal synchronized in phase with a desired horizontal synchronization signal cannot be obtained.

Even in a case that the horizontal synchronization signal including noises in receiving the weak electric field signal is input to the phase comparator 16 immune to noises, the phase comparator 16 outputs noise components due to a random noise. However, since the lowpass filter 18 cancels the noise components, it resultantly outputs only phase comparison components with regularity of the normal horizontal synchronization signal and the quasi horizontal synchronization signal. Thus, the voltage control type oscillator 22 oscillates with a desired oscillation frequency (31.5KHz) in the first PLL loop, resulting in a quasi horizontal synchronization signal having the same frequency and phase as the horizontal synchronization signal.

Furthermore, malfunction is caused by applying directly to the phase/frequency comparator 26 the horizontal synchronization signal including the noise in receiving the weak electric field signal shown in FIG. 7 (b). Therefore, it is considered to remove the noise causing this malfunction. That is, by passing the horizontal synchronization signal from the synchronization separating circuit 14 through a bandpass filter having its center frequency of 15.73KHz, the horizontal synchronization signal with its noise components removed, shown in FIG. 7 (c), may be applied to the phase/frequency comparator 26. In this configuration, however, an output signal of the bandpass filter is shifted by $\Delta T$ in time due to the filter processing as shown in FIG. 7 (c). That is, the phase of an output signal of the oscillator 30 is shifted by this $\Delta T$. Since the horizontal clock signal for horizontally driving the liquid crystal panel is synchronized in phase with an output of the voltage controlled oscillator 30, the horizontal position of the picture reproduced on the screen is deviated.

It is also considered to estimate or calculate the value of this $\Delta T$ and to correct the deviation of this horizontal position. However, this estimation is annoying and difficult because it requires consideration of a random noise, the deviation in the delay time $\Delta T$ in the bandpass filter and the deviation in signal widths of the received horizontal synchronization signal, (the output of the bandpass filter) due to noises.

The foregoing Japanese Pat. Laying Open Gazette No. 57-41078 discloses a method of generating a horizontal driving pulse in synchronization in phase with the horizontal synchronization signal in a matrix type television.

Moreover, Japanese Pat. Laying Open Gazette No. 57-8161 similarly discloses a method of providing a signal synchronized in phase with the horizontal synchronization signal by employing a PLL loop, as a horizontal driving pulse signal of a liquid crystal matrix display panel.

SUMMARY OF THE INVENTION

It is an object of the present invention to provide an improved phase synchronizing circuit without disadvantages of a conventional phase synchronizing circuit.

It is another object of the present invention to provide a phase synchronizing circuit of a simple configuration capable of providing a signal reliably phase-locked to a horizontal synchronization signal.

It is a further object of the present invention to provide a phase synchronizing circuit not affected by a signal delay in a noise filter, which is capable of providing a signal phase-locked accurately to the horizontal synchronization signal.

It is a still further object of the present invention to provide a phase synchronizing method of providing a signal always phase-locked to a received horizontal synchronization signal.

The phase synchronizing circuit according to the present invention comprises a circuit for separating and extracting at least a horizontal synchronization signal from an applied video signal, a first PLL loop relatively immune to noise for providing a signal synchronized in phase with the separated/extracted horizontal synchronization signal, and a second PLL or AFC loop for receiving the separated/extracted horizontal synchronization signal via a bandpass filter to provide a signal at least frequency-locked to an output of this bandpass filter. The first PLL loop shares with the second PLL or AFC loop in a voltage control type oscillator and a frequency divider.

The phase synchronizing circuit according to the present invention further comprises detecting circuitry for deciding whether or not the separated/extracted horizontal synchronization signal is in synchronization with an output of the frequency divider, and circuitry for activating either one of the first PLL loop or the second PLL or AFC loop in response to an output of the synchronization deciding circuitry.

The first PLL loop comprises a first comparator comparatively immune to noise, having an output characteristic with a plurality of S curves. The first comparator compares in phase the separated/extracted horizontal synchronization signal with the frequency divider output.

The second PLL or AFC loop comprises a second comparator having an output characteristic with a single S curve. The second comparator compares the bandpassed horizontal synchronization signal with the frequency divider output at least in frequency.

The first comparator is formed of a pulse width type detector relatively immune to noises. The second comparator is formed of an edge trigger type detector or a frequency edge trigger type phase comparator. The second comparator is also formed of a frequency comparator which compares frequencies of applied signals.

The phase synchronizing circuit according to the present invention further comprises circuitry for generating a quasi horizontal synchronization signal with a frequency same as that of the horizontal synchronization signal, and circuitry responsive to an output of the synchronization detector and a signal with its level inverted at a predetermined period for selecting one of an output of the bandpass filter and the quasi horizontal synchronization signal to supply the selected one to the second comparator.

A method of phase synchronization according to the present invention comprises the step of activating the first PLL loop when the synchronization detector is detecting a synchronizing state, and activating the second PLL loop when the synchronization detector is detecting a non-synchronizing state.

According to the above configuration, in the non-synchronizing state such as an operation starting time, the second PLL or AFC loop having a single lock range is activated, and the voltage control type oscillator is controlled by the noise-removed horizontal synchronization signal having a time delay caused by the bandpass filter. Accordingly, a signal which is frequency-locked to a received horizontal synchronization signal is first output from the frequency divider. In the frequency synchronizing state, the first PLL loop is activated by the output of the synchronization detector. Consequently, a signal is output from the frequency divider, which is locked in phase and frequency to the received horizontal synchronization signal due to the function of the first PLL loop. In this case, since the bandpass filter is not provided in the first PLL loop, a time delay does not occur corresponding to the horizontal synchronization signal, resulting in a reliably phase-locked signal.

Furthermore, at the time of non-synchronization, (particularly at the time of no-signal inputting,) an oscillation frequency and phase of the voltage control type oscillator can be fixed by controlling the voltage control type oscillator by employing the quasi horizontal synchronization signal, so that a fluctuation does not occur in a reproduced picture in this state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram schematically illustrating the entire configuration of a conventional liquid crystal television receiver;

FIG. 2A–2F are signal waveform diagrams illustrating an operation timing of a row driver of a liquid crystal panel shown in FIG. 1;

FIG. 3A–3F are signal waveform diagrams illustrating the operation of a column driver shown in FIG. 1;

FIG. 7 (a)–7 (c) are signal waveform diagrams for describing disadvantages in the conventional phase synchronizing circuit;

FIG. 8 is a diagram schematically illustrating a principle configuration of a phase synchronizing circuit according to the present invention;

FIGS. 13A and 13B are signal waveform diagrams illustrating the operation of the phase comparator and the phase/frequency comparator shown in FIG. 12;

FIG. 14 is a diagram illustrating an example of the detailed configuration of a lowpass filter shown in FIG. 9;

FIG. 15 is a diagram illustrating an example of the detailed configuration of an H gate shown in FIG. 9;

FIGS. 16A and 16B are signal waveform diagrams illustrating the operation of the H gate shown in FIG. 15.

DESCRIPTION OF THE PREFERRED EMBODIMENTS

Figure 4:
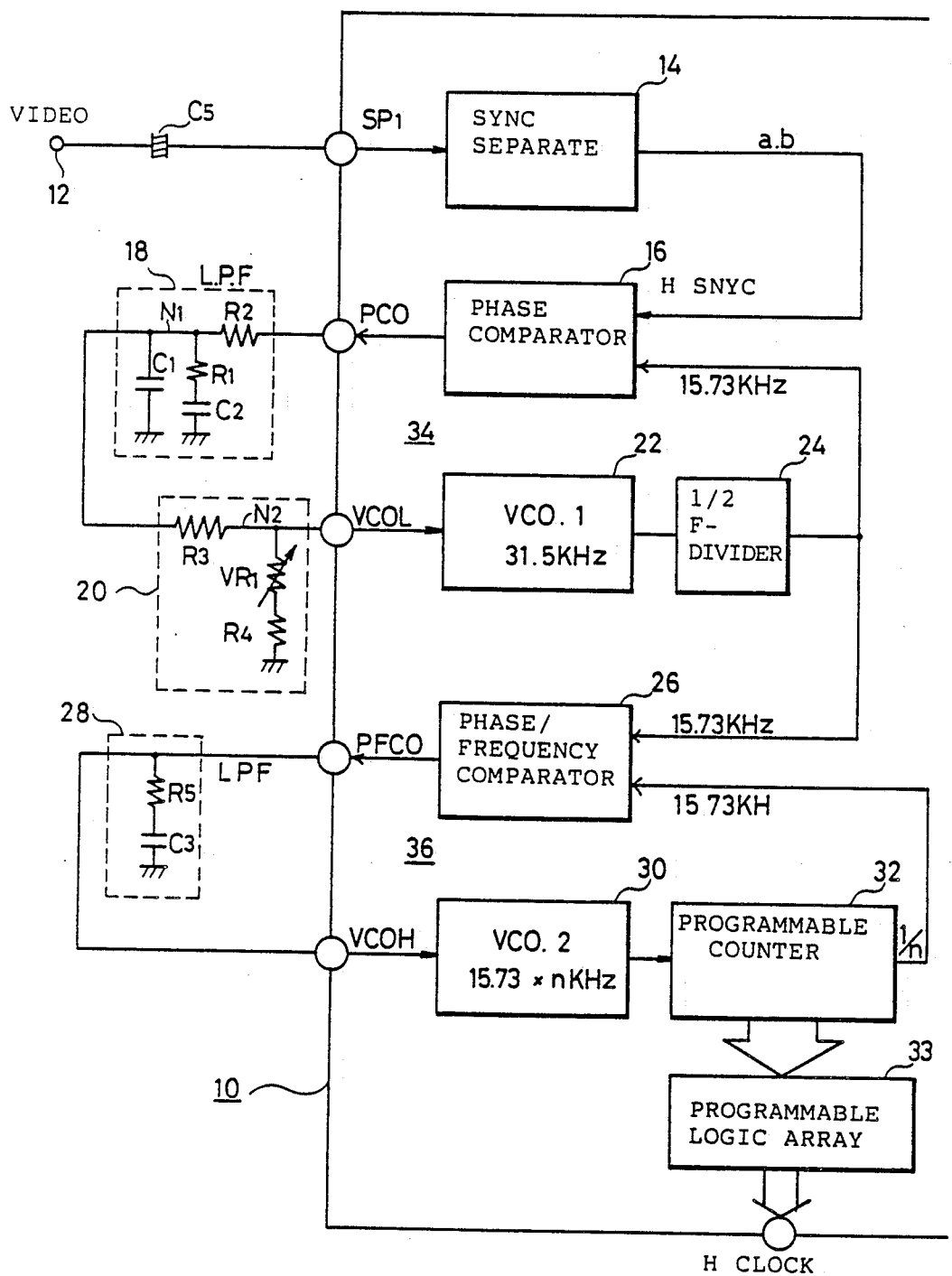
FIG. 4 is a diagram illustrating the configuration of a conventional phase synchronizing circuit.

FIG. 8 shows a principle configuration of a horizontal phase synchronizing circuit according to the present invention. Referring to this FIG. 8, the horizontal phase synchronizing circuit comprises a synchronization separating circuit 14, a phase comparator 16, a phase/frequency comparator 26, a bandpass filter 40, a switching circuit 42, a lowpass filter 44, a voltage control type oscillator 46 and a synchronization detector 48.

Figure 5:
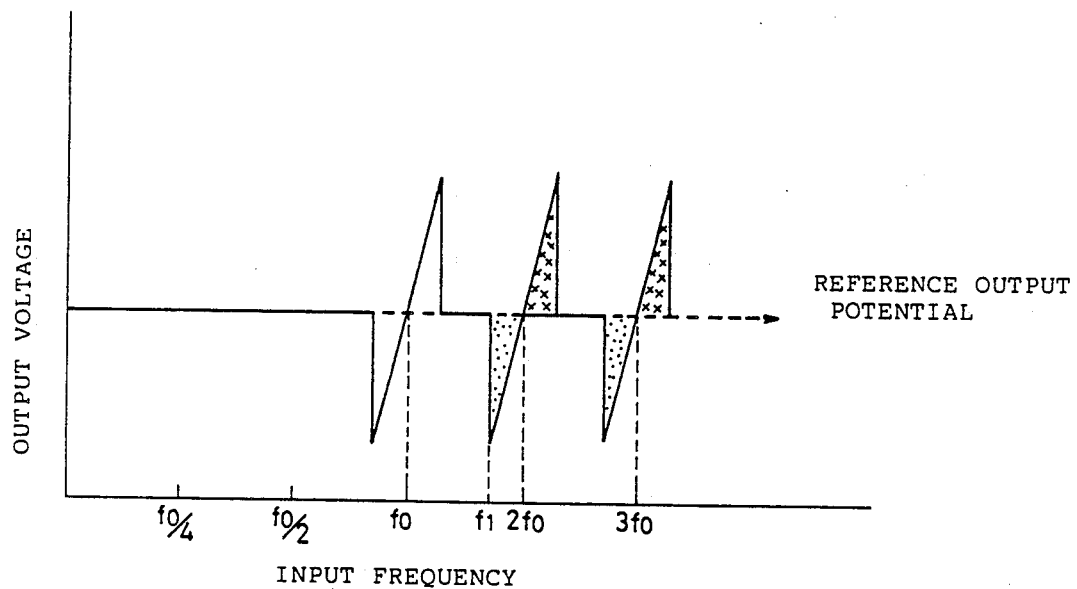
FIG. 5 is a diagram illustrating an output characteristic of a first phase comparator shown in FIG. 4.

The synchronization separating circuit 14 receives via a coupling capacitor C5 a video signal applied via an input terminal 12 and extracts a synchronization signal (a horizontal synchronization signal) to apply the same to the phase comparator 16. The phase comparator 16, which is a pulse width detecting type phase comparator having an output characteristic as shown in FIG. 5, compares the phase of the horizontal synchronization signal from the synchronization separating circuit 14 with that of an output of the voltage control type oscillator 46 to output a signal corresponding to a difference in these phases.

Figure 6:
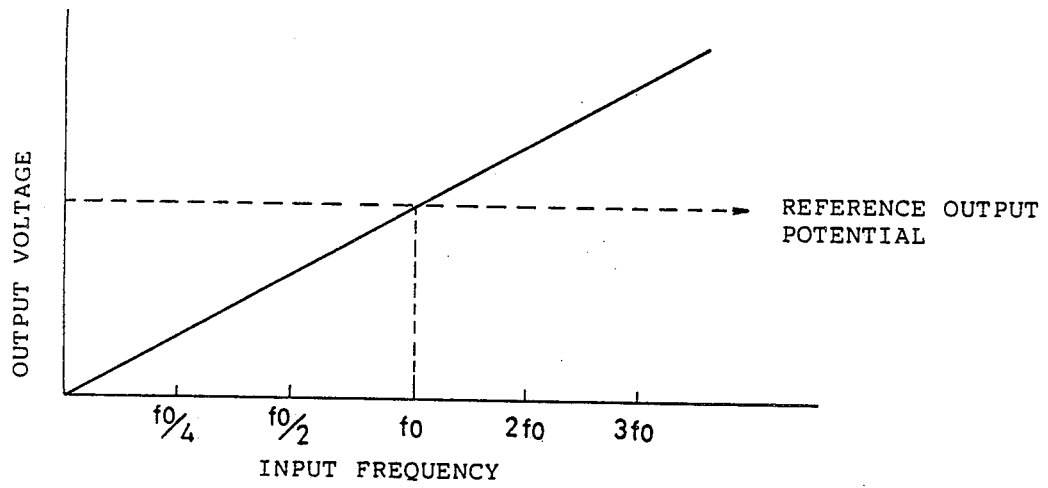
FIG. 6 is a diagram illustrating an output characteristic of a phase/frequency comparator shown in FIG. 4.

A received horizontal synchronization signal with its noise components removed by the bandpass filter 40 is applied to the phase/frequency comparator 26 and the synchronization detector 48. The phase/frequency comparator 26 having an output characteristic shown in FIG. 6 compares the phase and frequency of the horizontal synchronization signal from the bandpass filter 40 with those of the output of the voltage control type oscillator 46. The synchronization detector 48 compares the received horizontal synchronization signal with the voltage control type oscillator 46 via the bandpass filter 40 and generates a signal indicating whether or not the output of the voltage control type oscillator 46 is in synchronization with the received horizontal synchronization signal. This synchronization detector 48 is a circuit for detecting the fact that the output signal of the voltage control type oscillator 46 attains a normal horizontal synchronization frequency (15.73KHz), and also compares the phases of the output of the voltage control type oscillator and of the received horizontal synchronization signal. That is, the synchronization detector 48 detects the presence or absence of the received horizontal synchronization signal from the bandpass filter 40 when the output of the voltage control type oscillator 46 rises, and decides that synchronization is established when the received horizontal synchronization signal exists during a predetermined period.

The switching circuit 42 responds to an output of the synchronization detector 48, by connecting a contact thereof to the contact e or f. The switching circuit 42 has its contact connected to the f when the synchronization detector 48 is detecting a non-synchronizing state, but to the e when the detector 48 is detecting a synchronizing state.

The lowpass filter 44 applies a direct current control voltage obtained by removing the high frequency components included in an output of the switching circuit 42, to a voltage control terminal of the voltage control type oscillator 46.

The voltage control type oscillator 46, which is not illustrated in detail, includes a 1/n frequency divider to output a horizontal frequency signal $f_H$ with the frequency 15.73KHz and a frequency $n \cdot f_H$ for generating a horizontal driving pulse corresponding to the number of pixels. The signal of the frequency $n \cdot f_H$ is transmitted to a programmable logic array (PLA), and thus the horizontal pulse is produced therein.

A first PLL loop is constituted by the phase comparator 16, the switching circuit 42, the lowpass filter 44 and the voltage control type oscillator 46. A second PLL loop is constituted by the phase/frequency comparator 26, the switching circuit 42, the lowpass filter 44 and the voltage control type oscillator 46.

An output of the bandpass filter 40 is applied to the synchronization detector 48 in the configuration shown in FIG. 8. However, when the synchronization detector 48 itself comprises a function of removing noise components, it may be configured such that a received horizontal synchronization signal separated by the synchronization separating circuit 14 is directly applied to the synchronization detector 48 as shown by the broken line in FIG. 8. Furthermore, since the synchronization detector 48 performs a phase comparing operation as described above, it can also be configured that a part of the circuit configuration thereof is shared with the phase/frequency comparator 26. An operation will then be described.

First of all, the non-synchronizing state is provided at an operation starting time. At this time, the synchronization detector 48 outputs a signal of the L level indicating the non-synchronizing state to apply the same to the switching circuit 42. The switching circuit 42 connects its contact to the f in response to this switching control signal of the L level. Accordingly, the second PLL loop first starts operating. A received horizontal synchronization signal is applied to the phase/frequency comparator 26 via the bandpass filter 40. The bandpass filter 40 removes the noise components to extract the horizontal synchronization signal components. Therefore, although the deviation ΔT (see FIG. 7) occurs in this case, an oscillation frequency of the voltage control type oscillator 46 is captured in the frequency of the received horizontal synchronization signal. Moreover, in this configuration, since the phase/frequency comparator 26 performs not only a frequency comparison but also a phase comparison, the output of the voltage control type oscillator 46 has its output signal phase also captured in the received horizontal synchronization signal to some extent.

When the oscillation frequency and phase of the voltage control type oscillator 46 approach (or coincide with) those of the received horizontal synchronization signal due to the second PLL loop, the synchronization detector 48 decides that the synchronization is established, so that it outputs a signal of the H level. Accordingly, the switching circuit 42 has its contact switched to the contact e, so that the first PLL loop (including the phase comparator 16, the lowpass filter 44 and the voltage control type oscillator 46) starts operating.

The phase comparator 16 in the first PLL loop compares the phase of a received horizontal synchronization signal from the synchronization separating circuit 14 with that of a horizontal frequency signal $f_H$ from the voltage control type oscillator 46 and outputs a signal corresponding to the difference between these phases. Accordingly, the phase control is carried out by the first PLL loop, so that a signal is output from the voltage control type oscillator 46, which is synchronized in phase and frequency with the received horizontal synchronization signal.

As has been described, the output of the voltage control type oscillator 46 is so controlled by operating the second PLL loop that the first PLL loop can capture at least the oscillation frequency of the voltage control type oscillator 46 into a normal oscillation frequency (15.73KHz) thereof, in the present invention. Therefore, the voltage control type oscillator 46 does not erroneously oscillate at the stable state with the frequency twice or three times the normal frequency (15.73KHz), thereby obtaining a horizontal driving pulse reliably synchronized in phase with the received horizontal synchronization signal.

Furthermore, in the first PLL loop, the received horizontal synchronization signal from the synchronization separating circuit 14 is directly applied to the phase comparator 16 without passing through the bandpass filter 40, thereby preventing the occurrence of the deviation in time ΔT (see FIG. 7) caused by the bandpass filter.

The phase/frequency comparator is employed in the second PLL loop; however, it can be replaced by a comparator with the output characteristic shown in FIG. 6, such as an edge trigger type phase comparator, or a frequency comparator.

When simply using a frequency comparator as the comparator 26, it is necessary to replace the synchronization detector 48 with a frequency coincidence detector (a kind of frequency detecting means). When using the frequency comparator as the comparator 26, the second PLL loop becomes an AFC (automatic frequency control) loop.

That is, it is a key factor of the present invention to capture the oscillation frequency of the voltage control type oscillator 46 into the normal oscillation frequency by operating the second PLL loop (or the AFC loop) to an extent that the oscillation frequency of the oscillator 46 can be captured in the normal frequency (15.73KHz) in the first PLL loop.

Furthermore, when switching the switching circuit 42 from the contact f to the e, voltage control type oscillator 46 has its output signal phase changed. However, this is such a very small change that the synchronization detector 48 keeps outputting the signal of the H level indicating the synchronization detecting state.

Moreover, a comparator may be employed as the phase/frequency comparator 26, which serves as the frequency comparator in the PLL unlock and as the phase comparator in the PLL lock. The comparator having such a configuration is, for example, MC4044, PC2 of CD74HC4046A, PC2 of CD4046A etc. manufactured by Motorola, Inc.

Figure 9:
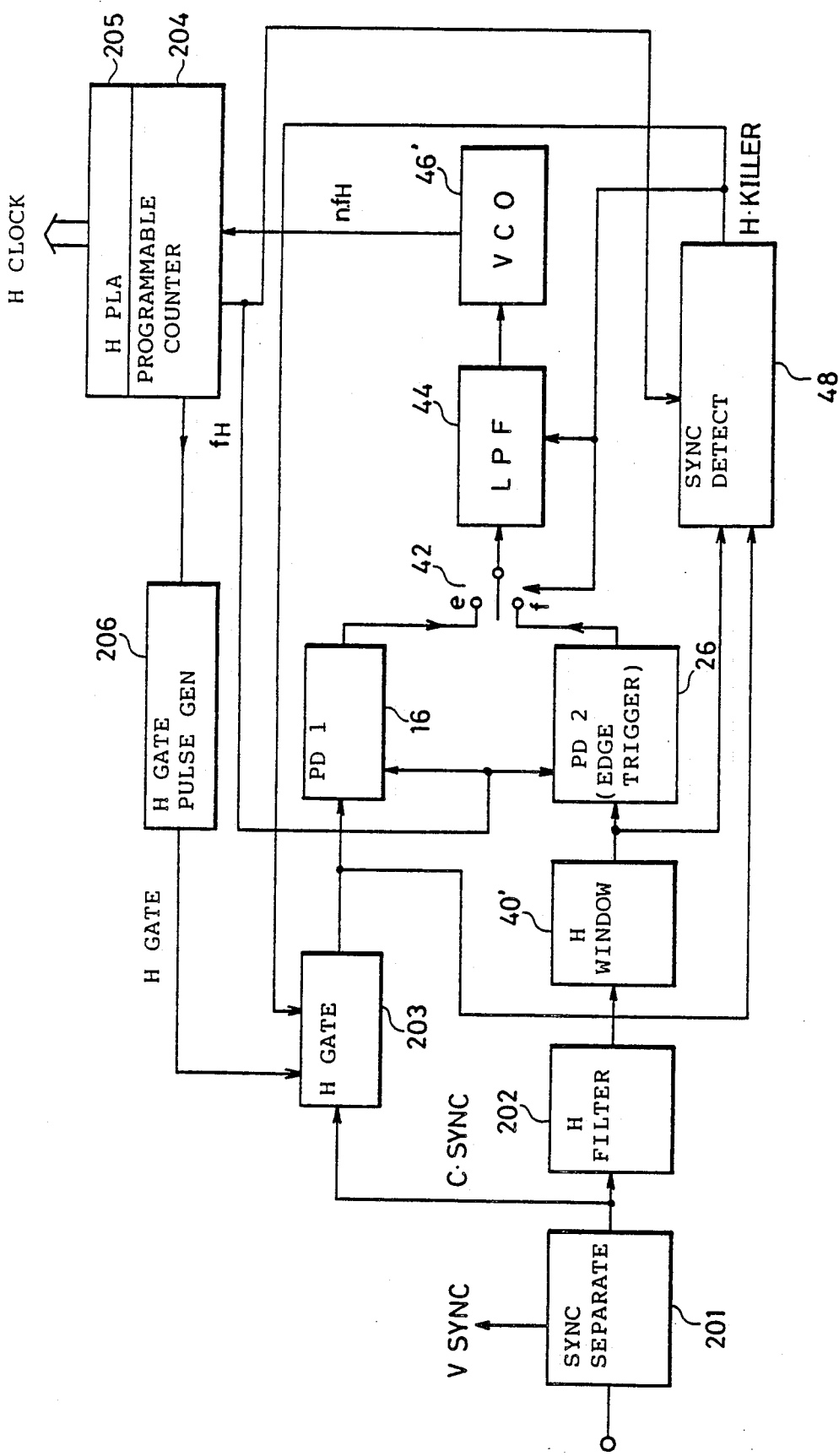
FIG. 9 is a diagram illustrating the configuration of a phase synchronizing circuit according to one embodiment of the present invention.

FIG. 9 schematically shows a detailed configuration of the horizontal phase synchronizing circuit according to one embodiment of the present invention. In this figure, those corresponding to the circuits shown in the FIG. 8 are denoted with like reference numerals.

Referring to FIG. 9, the synchronization separating circuit 14 (see FIG. 8) corresponds to a synchronization separating circuit 201, an H gate 203 and an H filter 202. The bandpass filter 40 in FIG. 8 corresponds to an H window 40' The voltage control type oscillator 46 in FIG. 8 corresponds to a voltage control type oscillator 46' and a programmable counter 204. Phase comparator 16 is pulse width type phase detector, and a comparator 26 is an edge trigger type phase detector.

The H filter 202 removes noise components included in a synchronization signal (a horizontal and vertical synchronization signal) CSYNC separated from the synchronization separating circuit 201 to apply the signal to the H window 40'. The H gate 203 passes therethrough a received horizontal synchronization signal from the synchronization separating circuit 201 in response to signals from an H gate pulse generator 206 and a synchronization detector 48. That is, the H gate 203 passes therethrough all the outputs of the synchronization separating circuit 201 when the synchronization detector 48 is detecting the non-synchronizing state, while it passes therethrough the output of the synchronization separating circuit 201 only during a period that a pulse signal is applied from the H gate pulse generator 206 when the synchronization detector 48 is detecting the synchronizing state.

The H gate pulse generator 206 generates a signal with a larger signal width than and the same frequency as a normal horizontal synchronization signal HSYNC in response to an output signal from the programmable counter 204. The H gate pulse generator 206 is, for example, formed by employing a PLA (Programmable Logic Array).

The programmable counter 204, which is a circuit for providing a frequency dividing ratio of an output of the voltage control type oscillator 40', sets the frequency dividing ratio n corresponding to the number of pixels of the liquid crystal display panel employing this horizontally phase synchronizing circuit. The output from the programmable counter 204 is supplied to an H·PLA205 to be subject to a predetermined logic processing, thereby generating a horizontal driving pulse HCLOCK synchronized in phase with the received horizontal synchronization signal.

The H window 40', serving as a bandpass filter having its center frequency as a horizontal synchronization signal frequency, is formed by employing a digital filter for integration of a circuit configuration. The operation of the circuit shown in FIG. 9 is similar to that shown in FIG. 8, however, it will briefly be described as follows. The non-synchronizing state is provided at the operation starting time. Therefore, a signal H·KILLER indicating the synchronizing state from the synchronization detector 48 is in the L level. As a result, the H gate 203 passes therethrough all the synchronization signals applied from the synchronization separating circuit 201. A synchronization signal from the synchronization separating circuit 201 has then its noise components removed by the H filter 202 and the H window 40', and then a frequency component corresponding to the horizontal synchronization signal is applied to the edge trigger type phase/frequency comparator 26.

A switching circuit 42 has its contact connected to the contact f. Therefore, the second PLL loop operates and thus the oscillation frequency of the voltage control type oscillator 46' is captured in the frequency n·$f_H$. The programmable counter 204 frequency-divides, by a factor of n, an oscillating signal from the voltage control type oscillator 46' to output as a quasi horizontal synchronization signal $f_H$. When an output of the synchronization detector 48 is inverted after an output signal of the voltage control type oscillator 46' is captured in predetermined frequency (and phase) due to the operation of the second PLL loop, the output signal H KILLER thereof rises to the H level. Accordingly, the switching circuit 42 has its contact switched to the contact e, and also the H gate 203 passes therethrough a applied signal only during the period of an H gate signal H GATE from the H gate pulse generator 206. Due to this function of the gate 203, the received horizontal synchronization signal has its noise components removed to be transmitted to the phase comparator 16. Accordingly, the first PLL loop functions to capture the oscillating signal of the voltage control type oscillator 46' into the normal oscillation frequency and phase and thus to keep stable oscillation.

In the configuration shown in FIG. 9, the H filter 202 removes undesirable noise components from the output of the synchronization separating circuit 201; however, the H filter 202 need not particularly be provided if the H window 40', the synchronization detector 48 and so on at the succeeding stage are immune to the noise components.

The lowpass filter 44 is provided between the switching circuit 42 and the voltage control type oscillator 46' in the configuration of FIG. 9. However, in place of this configuration, two lowpass filters may be provided at the succeeding stages of the phase comparator 16 and the phase/frequency comparator 26, respectively, so as to have their outputs selected in the switching circuit 42 to be supplied to the voltage control type oscillator 46'.

Figure 10:
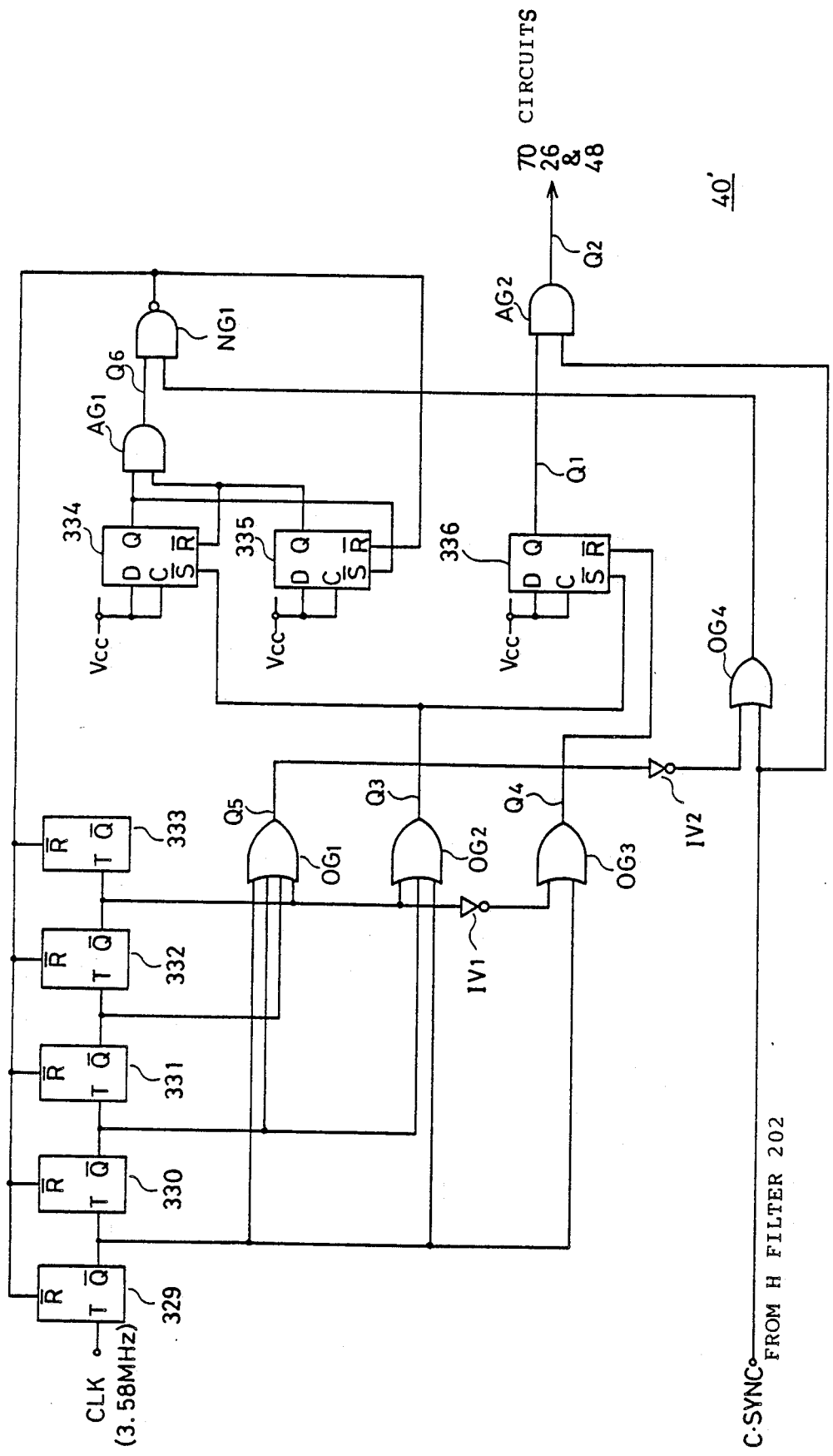
FIG. 10 is a diagram illustrating an example of the detailed configuration of an H window shown in FIG. 9.

FIG. 10 shows an example of the detailed configuration of the H window 40'. Referring to this figure, the H window 40' comprises five stages of cascade-connected T type flipflops (T-FF) 329, 330, 331, 332 and 333 for counting clock signals CLK externally applied (e.g., the frequency of 3.58MHz). The T-FFs 329-332 have their respective Q outputs transmitted to the respective T inputs of the T-FFs 330-333 at their succeeding stages. Therefore, the T-FF332 has its $\overline{Q}$ output provide a signal that the clock signal CLK is frequency-divided by 16 (when the T-FFs 329-333 are not reset in response to the horizontal synchronization signal CSYNC). The T-FFs 329-332 have their $\overline{Q}$ outputs transmitted to OR gates OG1–OG3, respectively.

The OR gate OG1 receives the respective $\overline{Q}$ outputs of the T-FFs 329-332. The OR gate OG 2 receives the outputs of the T-FFs 329, 330 and 332. The OR gate OG3 receives the $\overline{Q}$ output of T-FF329 and a signal of the $\overline{Q}$ output of the T-FF332 transmitted via an inverter IV1.

OR gate OG4, set/reset flipflops 334, 335 and 336, AND gates AG1 and AG2 and NAND gate NG1 are provided to supply reset timings of the counters (T-FFS 329-333) and the horizontal synchronization signal HSYNC through the comparator 26 of the succeeding stage.

The OR gate OG4 receives a signal of the output of the OR gate OG1 transmitted via an inverter V2, and a synchronization signal CSYNC (a horizontal and vertical synchronization signal) from the H filter 202. The set/reset flipflops 334-336 are each formed of a D type flipflop (D-FF). The set/reset flipflop 334 (hereinafter simply referred to as a $\overline{SR}$-FF) has its D input and C input connected to the supply potential Vcc, its set input $\overline{S}$ receive an output of the OR gate OG2, and its reset input $\overline{R}$ receive a Q output of the $\overline{SR}$-FF335. The $\overline{SR}$-FF335 has its D input and C input connected to the supply potential Vcc, its set input $\overline{S}$ connected to a Q output of the $\overline{SR}$-FF334, and its reset input $\overline{R}$ connected to an output of the NAND gate NG1. The $\overline{SR}$FF336 has its D input and C input connected to the supply potential Vcc, each set input $\overline{S}$ connected to the output of the OR gate OG2, and its reset input $\overline{R}$ connected to the output of the OR gate OG3. A Q output of the $\overline{SR}$-FF336 is applied to the AND gate AG2.

Figure 11:
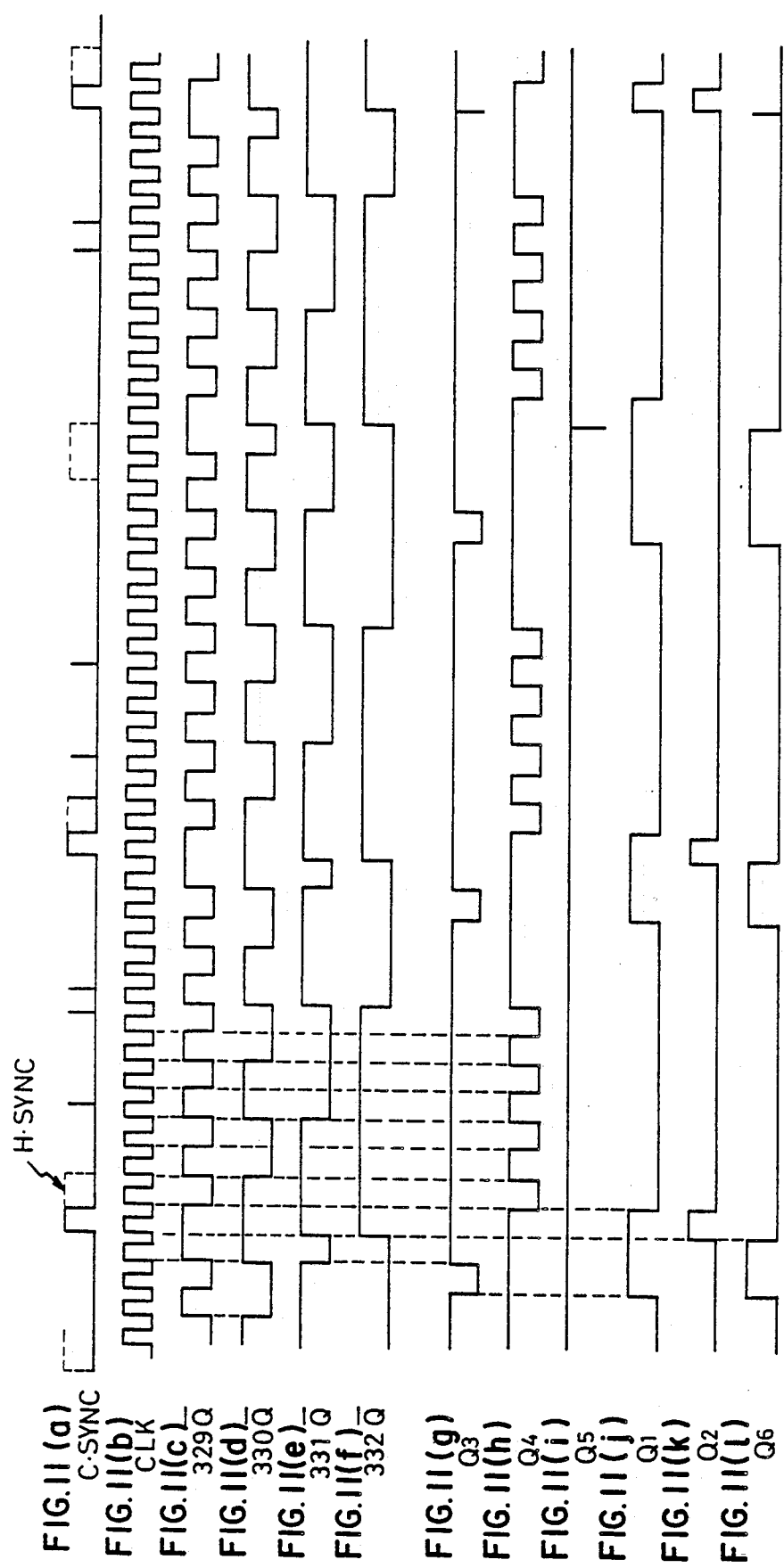
FIG. 11 (a)–7 (e) are diagrams illustrating the operation of the H window shown in FIG. 10.

The AND gate AG1 receives the Q output of the $\overline{SR}$-FF334 and the Q output of the $\overline{SR}$-FF335. The NAND gate NG1 receives outputs of the AND gate AG1 and OR gate OG4, respectively. The AND gate AG2 receives the Q output of the $\overline{SR}$-FF336 and the synchronization signal CSYNC from the H filter 202. The output of the AND gate AG2 is applied to the comparator 26 and the synchronization detector 48. An operation will now be described with reference to a waveform diagram of FIGS. 11.

The T-FFs 329-333 invert the levels of the respective $\overline{Q}$ outputs everytime the clock signals CLK are applied to their T inputs, and also output signals of "1" from their $\overline{Q}$ outputs when reset signals are applied to their reset terminals $\overline{R}$. Therefore, the T-FFs329-333 constitute a counter for counting 32 clock signals CLK as far as the reset signals are not applied thereto.

The OR gates output signals of the H level when at least one of input signals attains the H level. That is, the OR gates OG1-OG3 each outputs a signal of the L level when all the supplied input signals are in the L level. Therefore, when the counter (T-FFs329-333) counts eleven clock signals CLK, all the inputs of the OR gate OG2 attain the L level, and its output (a node Q3) attains L level. Accordingly, the $\overline{SR}$-FF334 is set, so that the Q output attains the H level. When the horizontal synchronization signal HSYNC is applied from the H filter 202 at this state, the output of the NAND gate NG1 attains the L level since the output of the AND gate AG1 (a node Q6) is in the H level. Accordingly, the T-FFs329-333 are reset, so that their $\overline{Q}$ outputs all attain the H level. As a result, the counting operation of the counter (T-FFs329-333) is synchronized with the horizontal synchronization signal. When the counter (T-FFs329-333) is reset, the $\overline{SR}$-FF335 is reset by the output of the NAND gate NG1 simultaneously and its Q output attains the L level, so that the $\overline{SR}$-FF334 is then reset. Therefore, since the level of the node Q6 is kept at the L level before the $\overline{SR}$-FFs334 and 335 count one clock signal CLK after being reset, the output of the NAND gate NG1 is in the H level. As a result, the counter (T-FFs329-333) performs the counting operation independent of receipt of a synchronization signal CSYNC from the H filter 202. Consequently, it can prevent the noise included in the synchronization signal CSYNC and a video-in-sync phenomenon that the video signal is deviated into the period of the synchronization signal.

When the counter (T-FFs329-333) counts 15 clock signals CLK, the output of the OR gate OG1 attains the L level even if the horizontal synchronization signal lacks, whereby a signal of the H level is applied via the OR gate OG4 to the NAND gate NG1, thus performing the same operation as when the horizontal synchronization signal is input.

Meanwhile, since the $\overline{SR}$-FF336 is reset responsive to the output of the OR gate OG2 (the node Q3) in counting 11 clock signals, the output of a node Q1 attains the H level. After the reset of the counter (T-FFs329-333) is completed, the $\overline{SR}$-FF336 is reset by the output of OR gate OG3 (the node Q4) and thus the potential on the node Q1 falls to the L level. Therefore, the AND gate AG2 is supplied from the $\overline{SR}$-FF336 with a gate signal which corresponds to the period when the horizontal synchronization signal will be applied in a normal time. Thus, the synchronization signal CSYNC (correctly HSYNC) from the H filer 202 is output to be transmitted to the comparator 26 and the synchronization detector 48. This capture of the horizontal synchronization signal ranges from 11 to 15 of the count values of the clock signals CLK. It becomes possible unlike an analogue filter by employing the H window circuit of this configuration to implement a bandpass filter for passing only a desired frequency band (a signal band having the horizontal synchronization signal as its center frequency) in a highly integrated circuit configuration.

Next, the configurations and operations of the phase comparator 16 and the phase frequency comparator 26 will be described.

Figure 12:
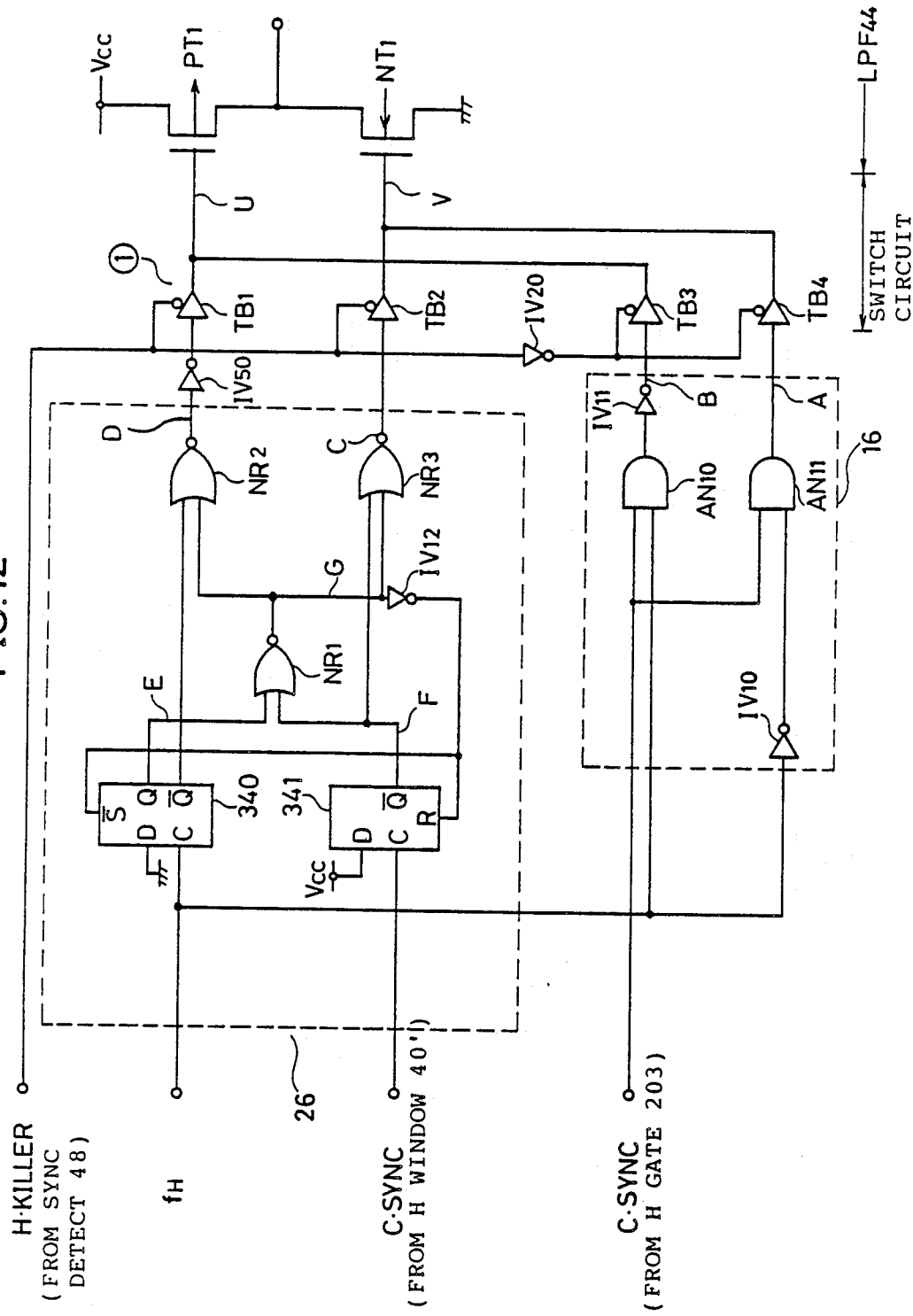
FIG. 12 is a diagram illustrating an example of the detailed configurations of a phase comparator 16 and a phase/frequency comparator shown in FIG. 9 and of a switching circuit.

Referring to FIG. 12, the phase comparator 16 is formed of the pulse width type phase detector, and the phase/frequency comparator 26 is formed of the edge trigger type phase detector.

The phase comparator 16 includes AND gates AN10 and AN11, and inverters IV10 and IV11. The AND gate AN10 receives a synchronization signal CYSNC from the H gate 203 and a quasi horizontal synchronization signal $f_H$ from the programmable counter 204. The AND gate AN11 receives the quasi horizontal synchronization signal $f_H$ via the inverter IV10 and also the synchronization signal CSYNC from the H gate 203. The inverter IV11 inverts an output of the AND gate AN10 to transmit the same.

The comparator 26 includes D flip-flops 340 and 341, NOR gates NR1, NR2 and NR3, and an inverter IV12. The D type flip-flop (hereinafter simply referred to as the D-FF) 340 has its clock input C receive the quasi horizontal synchronization signal $f_H$ and its D input connected to the ground potential. The D-FF341 has its clock input C receive a synchronization signal CSYNC from the H window 40' and its D input connected to the supply potential Vcc. The D-FF340 has its Q output supply a signal of the L level each time the signal $f_H$ is applied to its clock input terminal C. The D-FF341 has its $\overline{Q}$ output provide a signal of the L level each time the synchronization signal CSYNC is applied to its clock input terminal C. Therefore, the D-FFs340 and 341 are triggered at the rising edges of the signals $f_H$ and CSYNC, respectively, to change their output states.

The NOR gate NR1 receives the Q output of the D-FF340 and the $\overline{Q}$ output of the D-FF341. The output of the NOR gate NR1 is applied via the inverter IV12 to a set input $\overline{S}$ of the D-FF340 and a reset input $\overline{R}$ of the D-FF341.

The NOR gate NR2 receives an output of the NR gate NR1 and a $\overline{Q}$ output of the D-FF340. The NOR gate NR3 receives the $\overline{Q}$ output of the D-FF341 and the output of the NOR gate NR1. An operation will then be described.

First of all, a description will be given on the operation in the case that the quasi horizontal synchronization signal $f_H$ and the received synchronization signal CSYNC have the same frequencies but different phases, as shown in FIGS. 13A. The AND gate AN10 and AN11 each take a logical product of applied signals to output the same. Therefore, signal waveforms shown in FIG. 13A (c) and (d) appear on nodes A and B. Now, if a pulse width of the quasi horizontal synchronization signal $f_H$ is set twice that of the horizontal synchronization signal of the received synchronization signal CSYNC, the quasi horizontal synchronization signal $f_H$ is synchronized in phase with the received horizontal synchronization signal HSYNC when a pulse width of a signal appearing on the node A is equal to that of a signal appearing on the node B. The phase comparator 16 of the pulse width type detects a difference in phase between the received synchronization signal CSYNC and the quasi horizontal synchronization signal $f_H$ in accordance with a difference in pulse width between the signals on the nodes A and B. Therefore, when the pulse width of the signals on the nodes A and B are equal to each other, the PLL loop including this phase detecting comparator 16 oscillates stably. Furthermore, as can be seen in this configuration, this comparator 16 is not affected by noises and be able to perform phase comparison, however, it provides the same output characteristic to a sideband (a high harmonic $2f_H$, $3f_H$ . . . ) of the quasi horizontal synchronization signal $f_H$ In the other comparator 26, the D-FF340 outputs a signal of the L level everytime the quasi horizontal synchronization signal $f_H$ is applied thereto, while the D-FF341 outputs a signal of the L level everytime the synchronization signal CSYNC is applied thereto. The D-FFs340 and 341 both transmit their output signals to the NOR gate NR1. The NOR gate NR1 outputs a signal of the H level only when its two inputs are both in the L level. In such a timing relation as shown in FIGS. 13A, the inputs of the NOR gate NR1 both attained the L level when the Q output of the D-FF340 attain the L level, so that the D-FF340 is set via the inverter IV12, but the D-FF341 is reset. Therefore the potential on a node E instantly falls to the L level each time this quasi horizontal synchronization signal $f_H$ is applied thereto, while the potential on a node F is in the L level during the period of the phase difference between the synchronization signal CSYNC and the quasi horizontal synchronization signal $f_H$. As a result, the potential on a node D is fixed to the L level, and the potential on a node C attains the same signal waveform as that of the node A.

Next, a description will be given on the operation when the quasi horizontal synchronization signal $f_H$ and the received synchronization signal CSYNC have different frequencies with reference to FIGS. 13B. FIGS. 13B shows an example of the case that the frequency of the quasi horizontal synchronization signal $f_H$ is half that of the received horizontal synchronization signal CSYNC. In this case, a signal shifted by one period of the received synchronization signal appears in the same phase as that of the horizontal synchronization signal $f_H$ on each of the nodes A and B. Meanwhile, a signal of the L level is output to the node C, and an inverted signal of the quasi horizontal synchronization signal $f_H$ appears on the node D.

The outputs of the phase comparator 16 and the phase/frequency comparator 26 are switched over by employing three-state buffers TB1-TB4 constituting the switching circuit 42. Each of the three-state buffers TB1-TB4 is rendered conductive when a signal of the L level applied to their control terminals; otherwise their outputs become a high impedance state. The buffer TB1 receives the output of the NOR gate NR2 via an inverter IV50, and the buffer TB2 receives the output of the NOR gate NR3. The buffer TB3 receives the output of the AND gate AN10 via an inverter IV11, and the buffer TB4 receives the output of the AND gate AN11. The three-state buffers TB1 and TB2 have their control terminals supplied with a synchronization detecting signal H·KILLER from the synchronization detector 48, while the three-state buffers TB3 and TB4 have their control terminals supplied with the synchronization detecting signal H·KILLER via an inverter IV20. Therefore, the three-state buffers TB1 and TB2 are rendered conductive so as to select the output of the phase/frequency comparator 26 in the non-synchronizing state, while the three-state buffers TB3 and TB4 are rendered conductive to select the output of the phase comparator 16 in the synchronizing state.

The configuration and operation of the lowpass filter 44 will be described.

Referring to FIG. 14, the lowpass filter 44 includes a p channel MOS transistor PT1 and an n channel MOS transistor NT1 at its input stage. The p channel MOS transistor PT1 and the n channel MOS transistor NT1 are complimentarily connected to each other between a supply potential Vcc and the ground potential. The p channel MOS transistor PT1 has its gate supplied with an output of the switching circuit 42, i.e, the potential on a node U. The n channel MOS transistor NT1 has its gate supplied with the potential on an output node V of the switching circuit. The potential on a connecting point of the p channel MOS transistor PT1 and n channel MOS transistor NT1 is transmitted via resistors R11 and R12 to an inverter IV30. An analog switch AS1 is provided in parallel to the resistor R12. The analog switch AS1 has its control terminal supplied with synchronization detecting signal H·KILLER from the synchronization detector 48 via an inverter IV31. A capacitor C10 and a resistor R13 are connected in series between a node I (the connecting point of the resistor R12 and the inverter IV30) and a ground potential. A series body of the analog switch AS2 and a resistor R14 is provided in parallel to the resistor 13. A capacitor C11 is provided between the node I and the ground potential. The analog switch AS2 has its control terminal received the synchronization detecting signal H·KILLER from the synchronization detector 48. N channel MOS transistor NT2, resistors R20 and R21 are provided to invert an output of the inverter IV30 and transmit the same. The output of the inverter IV30 is transmitted to the gate of the n channel MOS transistor NT2. A direct control voltage signal is transmitted from the connecting point of the resistors R20 and R21 to a voltage control terminal of the voltage controlled oscillator 46′.

The analog switches AS1 and AS2 are rendered conductive when a signal of the H level is applied to their control terminals. The lowpass filter 44 has a function of converting the output of the comparator 26 or 16 into a direct current potential to provide a control voltage to the voltage controlled oscillator 46'. If a time constant of the lowpass filter 44 is large, the PLL loop takes time to be locked. Accordingly, when the power supply is on or when a channel is changed, it takes time for a reproduced picture to be at the normal state, however, resulting in improvements in weak electric field characteristics.

If the time constant of the lowpass filter 44 is small, the PLL loop does not take much time to be locked, but follows the noise in the weak electric field, resulting in degradation in the weak electric field characteristics.

Similarly, an enhanced control sensitivity of the PLL loop causes the time required to lock the PLL loop to be shorter, and degrades the weak electric characteristics. On the other hand, the reduced control sensitivity causes the time required to lock the PLL loop to be longer, and improves weak electric field characteristics. It is a characteristic required for the PLL loop to reduce the time to be locked with the smaller time constant and enhanced control sensitivity in the non-synchronizing state, and to slightly degrade the control sensitivity with the larger time constant and to improve the weak electric field characteristics in the synchronizing state. The operation will now be described.

When the potential on the node U attains the L level, the p channel MOS transistor PT1 is turned on so that an electric current i flows from the supply potential Vcc through the resistors R11 and R12 into the capacitor C10 to be charged. When the potential on the node V is in the H level, the n channel MOS transistor NT1 is turned on, so that the charged capacitor C10 is discharged through the resistors R11 and R12. When the potential on the node U is at the H level and that on the node V is at the L level, the transistors PT1 and NT1 are turned off, so that the potential of the capacitor C10 is held. It does not occur that the potential on the node U attains the L level and that on the node F attains the H level (the potential on the node D is transmitted via an inverter IV50 to the node U; see FIG. 12)

A direct current potential on a node I is provided by a difference between the period when the p channel MOS transistor PT1 is ON (the period when the potential on the node U is at the L level) and the period when the n channel MOS transistor NT1 is ON (the period when the potential on the node V is at the H level). After DC-amplified in the inverter IV30 (having an input stabilizing capacitor C11 at its input portion), the potential on the node I is supplied through the n channel MOS transistor NT2 to the control terminal of the voltage control type oscillator 46'.

Since the signal H·KILLER is at the L level at the non-synchronizing state of the PLL loop, the analog switch AS1 is turned on and the analog switch AS2 is turned off. The turning on of the analog switch AS1 causes the short-circuited resistor R12 and the increased current i, resulting in the improvement in the control sensitivity of the PLL loop. Since the analog switch AS2 is turned off simultaneously at this time, only the resistor R13 is connected to the capacitor C12 and hence the time constant in the lowpass filter 44 becomes smaller. Therefore, the PLL loop requires a shorter time period to capture it and to be locked.

The synchronization detecting signal H·KILLER attains the H level at the synchronizing state. Therefore, the analog switch AS1 is turned off and the analog switch AS2 is turned on. The turning off of the analog switch AS1 causes a series connection of the resistors R11 and R12 and the decreased current i, thereby degrading the control sensitivity of the PLL loop. Meanwhile, the turning on of the analog switch AS2 causes a parallel connection of the registers R13 and R14 and a smaller time constant of the lowpass filter. As a result, the weak electric field characteristics are improved.

A circuit configuration of the H gate will now be described. Referring to FIG. 15, the H gate 203 includes an inverter IV50 for receiving an H gate signal from the H gate pulse generator 206, a NAND gate NA50 for receiving the synchronization detecting signal H·KILLER from the synchronization detector 48 and an output of the inverter IV50, and an AND gate AG50 for receiving an output of the NAND gate 50 and the received synchronization signal CSYNC from the synchronization separating circuit 201. An output of the AND gate 50 is transmitted to the phase comparator 16 and to the synchronization detector 48; The operation will now be described with reference to operation waveform diagrams of FIGS. 16A and 16B. FIGS. 16B is an enlarged view of a broken-line block part shown in FIGS. 16A.

The received synchronization signal CSYNC includes a horizontal synchronization signal HSYNC and a vertical synchronization signal. The H gate 203 need be closed during the period of this vertical synchronization signal (including equivalent pulses for also defining a vertical fly-back period). Accordingly, the gate signal HGATE from the H gate pulse generator 206 is not to be generated during this vertical synchronization signal period. The synchronization detecting signal H·KILLER is at the L level in the non-synchronizing state. Therefore, an output of the NAND gate NA50 attains the H level to render the AND gate AG50 enable, and thus to pass therethrough all the synchronization signals CSYNC from the synchronization separating circuit 201.

At the synchronizing state, the synchronization detecting signal H·KILLER is at the H level, and the NAND gate NA50 serves as an inverter. Therefore, the gate signal H GATE is transmitted via the inverter IV50 to the NAND gate NA50, and thus the AND gate AG50 is enabled only during the period when the gate signal HGATE is applied to. The gate signal HGATE has a pulse width larger than that of the synchronization signal, as shown in FIG. 16B. Thus, the horizontal synchronization signal applied when the AND gate AG50 is enabled is only extracted to be transmitted to a circuit at the succeeding stage. This prevents undesirable components such as noises or the video-in-sync included in the synchronization signal from being transmitted.

Now, a description will be given on a method of deriving the synchronization detecting signal H·KILLER from the synchronization detector 48. The synchronization detector 48 has a portion of detecting presence or absence of the horizontal synchronization signal, and a block for processing in an average value sense the result of this detection. In the detection of synchronization, when the horizontal synchronization signal HSYNC separated by the synchronization separating circuit 14 exists after the frequency divided signal $f_H$ from the voltage control type oscillator 46 attains the H level, the clock signals are counted during the period of this horizontal synchronization signal HSYNC. The detector 48 decides that synchronization is established to issue an H level signal, if the number of counted clocks is not less than a predetermined value. The detector 48 decides that synchronization is not established if the number of the clocks is not more than the predetermined value, so that a signal of L level is output therefrom. In general, the rising period of the frequency divider output $f_H$ is approximately the same as that of the horizontal synchronization signal HSYNC when employing the phase/frequency comparator in the synchronizing state. However, the frequency divider output $f_H$ is made delayed by a predetermined time period from the horizontal synchronization signal HSYNC when employing the first phase comparator 16. This phase relationship is provided in the programmable counter 204.

Figure 17:
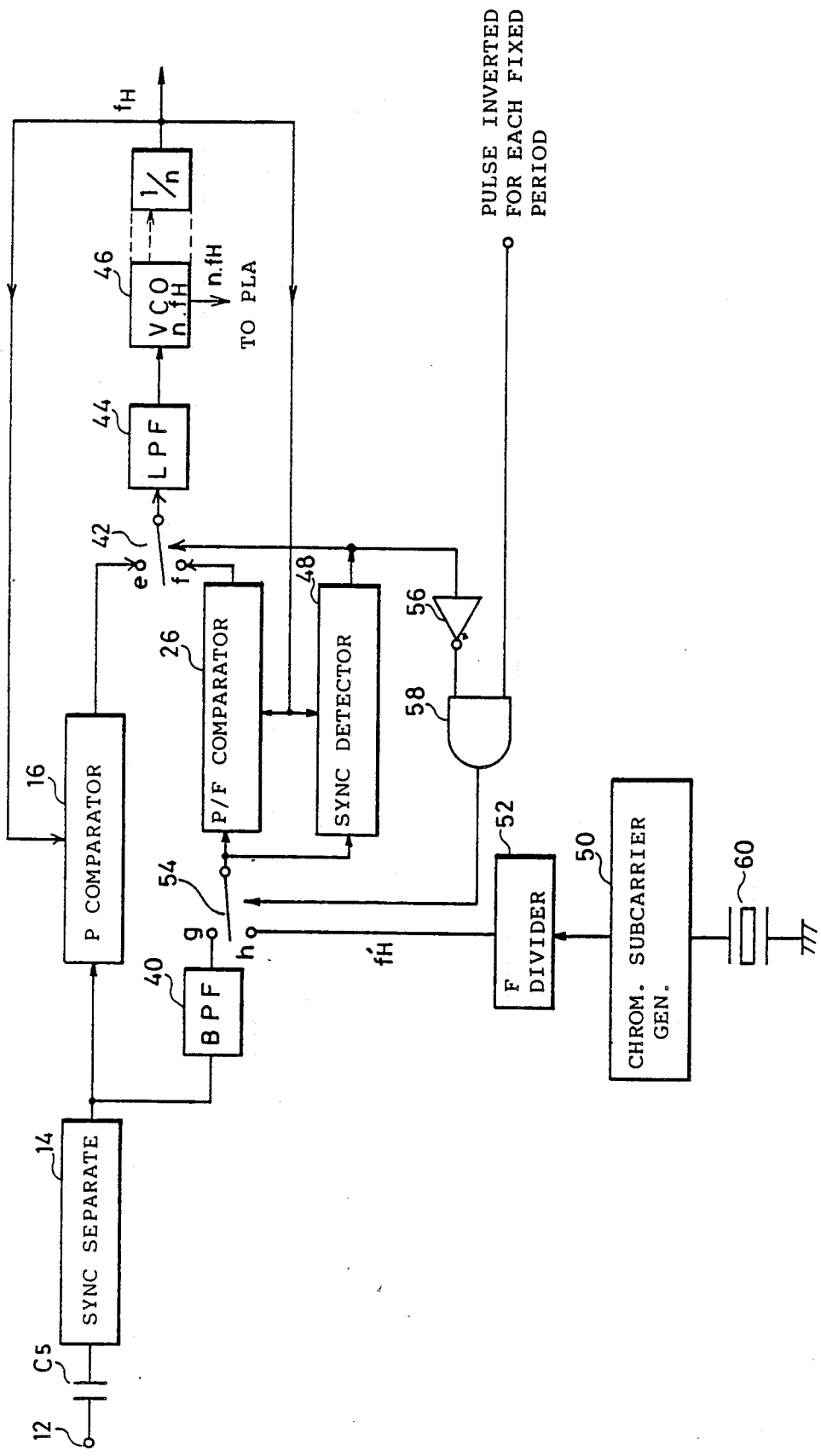
FIG. 17 is a diagram illustrating a schematic configuration of a phase synchronizing circuit according to another embodiment of the present invention.

In the embodiment shown in FIG. 8, a case may be considered where the second PLL loop formed of the phase/frequency comparator 26, the lowpass filter 44 and the voltage control type oscillator 46 free-runs due to noises so as not to be able to capture the oscillation frequency of the voltage control type oscillator 46 into the frequency of the horizontal synchronization signal, when no signal is received. In such a case, if an "on-screen" display is carried out for displaying characters, the number of a channel or the like on the display screen, a fluctuation occurs in an image of a character signal so as not to be able to perform an accurate on-screen display. FIG. 17 shows an embodiment which improves performance of the circuit in no signal receipt.

A phase synchronizing circuit according to the embodiment shown in FIG. 17 basically has the similar configuration as that shown in FIG. 8. The embodiment of FIG. 17 differs from that of FIG. 8 in the point that there are provided a chrominance subcarrier generator circuit 50 for producing a signal of 3.58MHz, a frequency divider circuit 52 for frequency-dividing with a ratio of 2/455 this signal of 3.58MHz, a second switching circuit 54 for switching a quasi horizontal synchronization signal $f_H$ from this frequency divider circuit 52 to and from a received horizontal synchronization signal from the synchronization separating circuit 14, and gate circuits 56 and 58 for performing a switch control of the switching circuit 54. The other part of the embodiment of FIG. 17 has the same configuration as that of FIG. 8, and their corresponding portions are denoted with like reference numerals.

The second switching circuit 54 has its terminal g supplied with a horizontal synchronization signal included in a received television signal, via the bandpass filter 40, and the other input terminal h supplied with a quasi horizontal synchronization signal $f'_H$ from the frequency divider circuit 52. The chrominance subcarrier generator circuit 50 adjusts an oscillation frequency of a crystal resonator 60 to provide the signal of 3.58MHz.

An inverter 56 inverts a synchronization detecting signal received from the synchronization detector 48. AND gate 58 receives an output of the inverter 56 and a pulse signal being inverted for each predetermined period. The AND gate 58 outputs a control signal of the switching circuit 54. An operation will now be described.

First of all, since no synchronizing state is provided at the operation starting time, the synchronization detector 48 outputs a signal of the L level. Accordingly, the first switching circuit 42 has its contact connected to the contact f. The signal of the L level from the synchronization detector 48 is applied to the inverter 56 to be inverted to a signal of the H level, and then applied to one input of the AND gate 58. The AND gate 58 has the other input supplied with a pulse signal which inverts in level for each predetermined period (for example, one field). Thus, the level of an output signal of the AND gate 58 is inverted for each predetermined period to switch the contact of the switching circuit 54 for each predetermined period. The second switching circuit 54 has its contact connected to the contact h when the output of the AND gate 58 is at the H level, while connected to the contact g when it is at the L level. That is, in the non-synchronizing state, one of the received horizontal synchronization signal CSYNC and quasi horizontal synchronization signal $f'_H$ are selectively and alternately applied to the phase/frequency comparator 26 for each predetermined period.

Such a case is now considered that the output of the AND gate 58 attains the H level during a certain fixed period. At this time, the second switching circuit 54 has its contact connected to the contact h. Therefore, the second PLL loop formed of the phase/frequency comparator 26, the lowpass filter 44 and the voltage control type oscillator 46 functions so that the oscillation frequency of the voltage control type oscillator 46 is captured in the frequency of the quasi horizontal synchronization signal $f'_H$ from the frequency divider circuit 52.

The output of the AND gate 58 attains the L level during the next fixed period. Accordingly, the contact of the second switching circuit 54 is connected to the contact g. Therefore, the second PLL loop functions so that the oscillation frequency of the voltage control type oscillator 46 is captured in the frequency of the horizontal synchronization signal HSCYNC separated through the synchronization separating circuit 14.

Next, when the oscillation frequency and phase of the voltage control type oscillator approach (or coincide with) those of the horizontal synchronization signal due to the second PLL loop, the synchronization detector 48 detects this approach (or coincidence), so that the output thereof attains the H level. Accordingly, the contact of the first switching circuit 42 is switched to the contact e.

As a result, the first PLL loop formed of the phase comparator 16, the lowpass filter 44 and the voltage control type oscillator 46 starts operating to perform a phase control.

The above described operation causes the second PLL loop to be locked to the frequency of the quasi horizontal synchronization signal $f'_H$ without free-running when the output of the AND circuit 58 is at the H level (when the quasi horizontal synchronization signal from the frequency divider circuit 52 is input), when carrying out the on-screen display at the time of non-synchronization (particularly at the time of no signal inputted). During this lock period, character signals are output from a character signal generator circuit, not illustrated herein, to be on-screen displayed on the liquid crystal display.

Meanwhile, when the output of the AND circuit 58 is at the L level, the character signals are inhibited from being output from the character signal generator circuit, not illustrated herein. At this time, even if the fixed period is, for example, one field period, each of liquid crystal elements of the liquid crystal display has a charge holding capacitor as shown in FIG. 1, so that if the input of the character signals is inhibited during this period, the liquid crystal display holds a previous display content.

Due to the above described configuration, since a fluctuation does not occur in the frequency and phase of the horizontal synchronization signal even in the performance of the on-screen display at the time of non-synchronization, particularly during no signal input, fluctuation does not occur in a displayed image.

The description has been given on the liquid crystal display as an example of a display device in the above described embodiments; however, a matrix type display such as a plasma display can substitute for the liquid crystal display to achieve the same effect as in the above described embodiments.

As has been described, the circuit according to the present invention is configured such that the second PLL loop having only a single lock region while causing some time delay $\Delta T$ is operated for the frequency locking, and that the first PLL loop immune to noise is then operated for the frequency and phase locking to the received horizontal synchronization signal. Therefore, such horizontal driving pulse can be obtained that the phase and frequency are always locked to the received horizontal synchronization signal.

In addition, the oscillation frequency and phase of the voltage control type oscillator can always be locked in high accuracy to the received horizontal synchronization signal, so that such a general-purpose horizontal synchronizing circuit can be obtained which can provide a constantly accurate horizontal synchronization signal even for a liquid crystal panel with different numbers of the pixels.

Moreover, since the horizontal driving pulse can be produced by employing the quasi horizontal synchronization signal with a stable frequency for each fixed period, no fluctuation occurs in the picture of displayed characters even if the "on-screen" display is carried out at the time of non-synchronization.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit for providing a signal synchronized in phase with a horizontal synchronization signal included in a video signal, comprising:

oscillation circuit means, said oscillation circuit means including an oscillator having an oscillation frequency thereof controllable, and frequency dividing means for frequency-dividing an output of said oscillator in a predetermined frequency dividing ratio;

separating/extracting means for separating and extracting at least said horizontal synchronization signal from said video signal;

first comparing means, connected to said oscillation circuit means and separating/extracting means, for comparing a phase of said horizontal synchronization signal from said separating/extracting means with a phase of an output of said frequency dividing means, said first comparing means having an output characteristic with a plurality of S curves;

bandpass means, connected to said separating/extracting means, for passing therethrough a signal of a predetermined frequency band out of an output of said separating/extracting means, said predetermined frequency band including a frequency of said horizontal synchronization signal;

second comparing means, connected to said bandpass means and said oscillation circuit means, for comparing at least a frequency of an output of said bandpass means with that of said frequency dividing means output, said second comparing means having an output characteristic with a single S curve;

synchronization detecting means, connected to said oscillation circuit means and said separating/extracting means, for detecting synchronization/non-synchronization of the horizontal synchronization signal extracted from said separating/extracting means with said frequency dividing means output; and selecting means responsive to an output of said synchronization detecting means, for selecting one of the outputs of said first and second comparing means to apply the selected one to said oscillator, an output of said selecting means controlling at least the oscillation frequency of said oscillator.

2. A circuit of claim 1, wherein said second comparing means comprises frequency comparing means for detecting a difference in frequency of applied signals, and said synchronization detecting means comprises a circuit for detecting coincidence or incoincidence in the frequencies of applied signals.

3. A circuit of claim 1, wherein said first comparing means comprises a pulse width type detector for providing a signal corresponding to a phase difference and respective pulse widths of applied signals.

4. A circuit of claim 1, wherein said second comparing means comprises an edge trigger type phase comparator for detecting a changing time point in level of each of applied signals to compare the phases of the applied signals.

5. A circuit of claim 1, wherein said second comparing means comprises means (26) for comparing in phase and frequency applied signals.

6. A circuit for providing a signal synchronized in phase with a horizontal synchronization signal included in a video signal, comprising:

oscillation circuit means, said oscillation circuit means including an oscillator having an oscillation frequency thereof controllable, and frequency dividing means for frequency-dividing an output of said oscillator in a predetermined frequency dividing ratio, said oscillator comprises a voltage control type oscillator;

separating/extracting means for separating and extracting at least said horizontal synchronization signal from said video signal;

first comparing means for comparing a phase of said horizontal synchronization signal from said separating/extracting means with a phase of an output of said frequency dividing means, said first comparing means having an output characteristic with a plurality of S curves;

bandpass means for passing therethrough a signal of a predetermined frequency band out of an output of said separating/extracting means, said predetermined frequency band including a frequency of said horizontal synchronization signal;

second comparing means for comparing at least a frequency of an output of said bandpass means with that of said frequency dividing means output, said second comparing means having an output characteristic with a single S curve;

synchronization detecting means for detecting synchronization/non-synchronization of the horizontal synchronization signal extracted from said separating/extracting means with said frequency dividing means output; and selecting means responsive to an output of said synchronization detecting means, for selecting one of the outputs of said first and second comparing means to apply the selected one to said oscillator, an output of said selecting means controlling at least the oscillation frequency of said oscillator, said selecting means comprises charging/discharging means for applying a direct current control voltage to said voltage control type oscillator, first adjusting means responsive to said synchronization detecting means output for adjusting a charge/discharge current value of said charging/discharging means, and second adjusting means for adjusting a charge/discharge time constant of said charging discharging means, responsive to an output of said synchronization detecting means.

7. A circuit of claim 1, wherein
said selecting means selects said first comparing means output in response to detection of a synchronizing state by said synchronization detecting means, while said selecting means selects said second comparing means output when said synchronization detecting means is detecting a non-synchronizing state.

8. A circuit for providing a signal synchronized in phase with a horizontal synchronization signal included in a video signal, comprising:

oscillation circuit means, said oscillation circuit means including an oscillator having an oscillation frequency thereof controllable, and frequency dividing means for frequency-dividing an output of said oscillator in a predetermined frequency dividing ratio;

separating/extracting means for separating and extracting at least said horizontal synchronization signal from said video signal;

first comparing means for comparing a phase of said horizontal synchronization signal from said separating/extracting means with a phase of an output of said frequency dividing means, said first comparing means having an output characteristic with a plurality of S curves;

bandpass means for passing therethrough a signal of a predetermined frequency band out of an output of said separating/extracting means, said predetermined frequency band including a frequency of said horizontal synchronization signal, said bandpass means includes window means for passing therethrough applied signals only during a period in which said horizontal synchronization signal included in said video signal is expected to be applied, said expected period being set longer than a width of said horizontal synchronization signal but sufficiently shorter than a period of said horizontal synchronization signal, said expected period being provided by counting clock signals having a predetermined frequency;

second comparing means for comparing at least a frequency of an output of said bandpass means with that of said frequency dividing means output, said second comparing means having an output characteristic with a single S curve;

synchronization detecting means for detecting synchronization/non-synchronization of the horizontal synchronization signal extracted from said separating/extracting means with said frequency dividing means output; and selecting means responsive to an output of said synchronization detecting means, for selecting one of he outputs of said first and second comparing means to apply the selected one to said oscillator, an output of said selecting means controlling at least the oscillation frequency of said oscillator.

9. A circuit for providing a signal synchronized in phase with a horizontal synchronization signal included in a video signal, comprising:

oscillation circuit means, said oscillation circuit means including an oscillator having an oscillation frequency thereof controllable, and frequency dividing means for frequency-dividing an output of said oscillator in a predetermined frequency dividing ratio;

separating/extracting means for separating and extracting at least said horizontal synchronization signal from said video signal, said separating/extracting means comprises gate means responsive to an output signal of a synchronization detecting means and a gate pulse produced responsive to said frequency dividing means output, for selectively passing applied signal, said gate means passes all the applied signals when the output signal of said synchronization detecting means indicates a non-synchronizing state, and passes signals applied from said separating/extracting means only during a period that said gate pulse is applied thereto when the output signal of said synchronization detecting means indicates a synchronizing state, and said gate pulse has the same frequency as that of said horizontal synchronization signal and a larger signal width than the width of said horizontal synchronization signal;

first comparing means for comparing a phase of said horizontal synchronization signal from said separating/extracting means with a phase of an output of said frequency dividing means, said first comparing means having an output characteristic with a plurality of S curves;

bandpass means for passing therethrough a signal of a predetermined frequency band out of an output of said separating/extracting means, said predetermined frequency band including a frequency of said horizontal synchronization signal;

second comparing means for comparing at least a frequency of an output of said bandpass means with that of said frequency dividing means output, said second comparing means having an output characteristic with a single S curve;

said synchronization detecting means for detecting synchronization/non-synchronization of the horizontal synchronization signal extracted from said separating/extracting means with said frequency dividing means output; and selecting means responsive to an output of said synchronization detecting means, for selecting one of the outputs of said first and second comparing means to apply the selected one to said oscillator, an output of said selecting means controlling at least the oscillation frequency of said oscillator.

10. A circuit for providing a signal synchronized in phase with a horizontal synchronization signal included in a video signal, comprising:

oscillation circuit means, said oscillation circuit mean including an oscillator having an oscillation frequency thereof controllable, and frequency dividing means for frequency-dividing an output of said oscillator in a predetermined frequency dividing ratio;

separating/extracting means for separating and extracting at least said horizontal synchronization signal from said video signal;

first comparing means for comparing a phase of said horizontal synchronization signal from said separating/extracting means with a phase of an output of said frequency dividing means, said first comparing means having an output characteristic with a plurality of S curves;

bandpass means for passing therethrough a signal of a predetermined frequency band out of an output of said separating/extracting means, said predetermined frequency band including a frequency of said horizontal synchronization signal;

second comparing means for comparing at least a frequency of an output of said bandpass means with that of said frequency dividing means output, sad second comparing means having an output characteristic with a single S curve;

synchronization detecting means for detecting synchronization/non-synchronization of the horizontal synchronization signal extracted form said separating/extracting means with said frequency dividing means output;

selecting means responsive to an output of said synchronization detecting means, for selecting one of the outputs of said first and second comparing means to apply the selected one to said oscillator, an output of said selecting means controlling at least the oscillation frequency of said oscillator;

signal generating means for generating a signal having the same frequency as that of said horizontal synchronization signal; and second selecting means responsive to said synchronization detecting means output and a signal having a level thereof inverted for each predetermined period, for selectively passing one of outputs of said bandpass means and said signal generating means to apply the same to both of said second comparing means and said synchronization detecting means.

11. A circuit for providing a signal synchronized in phase with a horizontal synchronization signal included in a video signal, comprising:

separating/extracting means for separating and extracting at least said horizontal synchronization signal from a received video signal;

a first PLL loop, said first PLL loop having a plurality of lock ranges, for providing a signal synchronized in phase with an output of said separating/extracting means and being coupled to the output of said separating/extracting means;

bandpass means for passing therethrough a signal within a predetermined frequency band including a frequency of said horizontal synchronization signal out of said separating/extracting means output;

an AFC loop for receiving the output of said bandpass means, said AFC loop having a single lock range with a frequency width thereof set large, said AFC loop providing a signal locked at least in frequency to said bandpass means output, said first PLL loop and said AFC loop sharing a voltage control type oscillator, said voltage control type oscillator including a frequency divider, said frequency divider having a variable frequency dividing ratio;

synchronization determining means for determining whether or not an output of said frequency divider means is in synchronization with a horizontal synchronization signal from said synchronization separating/extracting means, said synchronization determining means determining that synchronization or non-synchronization is established depending whether or not both of the applied signals at least have substantially the same frequency; and selecting means responsive to an output of said synchronization determining means for enabling one of said first PLL loop and said AFC loop.

12. A circuit of claim 11, wherein said AFC loop further has a function of locking the phase of the input and output signals thereof to each other, thereby forming a second PLL loop.

13. A method of separating/extracting a horizontal synchronization signal included in a video signal in a synchronization separating circuit and providing a signal phase-locked to the separating/extracted horizontal synchronization signal by using a voltage control type oscillator, said method comprising the steps of:

performing a first PLL loop operation, said first PLL loop operation including the step of directly receiving the horizontal synchronization signal separated/extracted through said synchronization separating circuit and receiving a frequency divided signal produced by frequencydividing an output of said voltage control type oscillator circuit in a predetermined ratio, the step of comparing both of the received signals by employing a first phase comparator which has an output characteristic with a plurality of S curves, and providing a first comparison output, and the step of controlling an oscillator phase of said voltage control type oscillator circuit in response to said first comparison output;

performing an AFC loop operation, said AFC loop operation including the step of passing an output of said synchronization separating/extracting circuit through a bandpass filter, therein removing an undesired noise component and providing a desired horizontal synchronization signal component, the step of comparing at least in frequency said bandpass horizontal synchronization signal with said frequency divided signal to provide a second comparison output by suing a second phase comparator having an output character of a single S curve, and the step of controlling at least the oscillation frequency of said voltage control type oscillator circuit according to said second comparison output; and deciding whether or not the horizontal synchronization signal separated and extracted through said synchronization separating circuit is in synchronization with said frequency divided signal to activate one of said first PLL loop and said AFC loop operation in accordance with a result of this decision, said first PLL loop operation is enabled only when a result of detecting synchronization indicates the synchronizing state.

14. A method of claim 13, wherein
said AFC loop operation step further comprises the step of comparing in phase said bandpassed horizontal synchronization signal with said frequency divided signal in said comparison step, wherein said AFC loop forms a PLL loop.

15. A method of claim 13, wherein said AFC loop further comprises the steps of
generating a signal having the same frequency as that of said horizontal synchronization signal, and
comparing in said second comparator an output of said frequency divider with one of the horizontal synchronization signal bandpassed in said bandpass step and said generated signal having the same frequency as that of horizontal synchronization signal, in response to the synchronization detecting result in said synchronization detecting step and to a signal with a level thereof inverted in a predetermined period.

* * * * *